US011784664B2

(12) United States Patent
Boussard et al.

(10) Patent No.: US 11,784,664 B2
(45) Date of Patent: Oct. 10, 2023

(54) METHODS AND SYSTEMS FOR BIT ERROR DETERMINATION AND CORRECTION

(71) Applicant: ÉCOLE DE TECHNOLOGIE SUPÉRIEURE, Montréal (CA)

(72) Inventors: Vivien Boussard, Saint-Herblain (FR); Stéphane Coulombe, Brossard (CA)

( * ) Notice: Subject to any disclaimer, the term of this patent is extended or adjusted under 35 U.S.C. 154(b) by 0 days.

(21) Appl. No.: 17/502,583

(22) Filed: Oct. 15, 2021

(65) Prior Publication Data

US 2022/0045696 A1    Feb. 10, 2022

Related U.S. Application Data

(63) Continuation of application No. PCT/CA2020/050724, filed on May 27, 2020.

(60) Provisional application No. 62/853,106, filed on May 27, 2019.

(51) Int. Cl.
*H03M 13/00* (2006.01)
*H03M 13/15* (2006.01)
*H03M 13/09* (2006.01)

(52) U.S. Cl.
CPC ....... *H03M 13/1575* (2013.01); *H03M 13/09* (2013.01)

(58) Field of Classification Search
CPC .................. H03M 13/1575; H03M 13/09
See application file for complete search history.

(56) References Cited

U.S. PATENT DOCUMENTS

| | | | | |
|---|---|---|---|---|
| 8,522,122 B2 * | 8/2013 | Alves | .................... | H03M 13/13 |
| | | | | 714/784 |
| 8,566,684 B1 * | 10/2013 | Ward | ................ | H03M 13/6561 |
| | | | | 714/796 |
| 8,621,321 B2 * | 12/2013 | Steiner | .............. | H03M 13/6561 |
| | | | | 714/780 |
| 8,683,293 B2 * | 3/2014 | Saxena | ............... | H03M 13/152 |
| | | | | 714/759 |
| 9,160,370 B2 * | 10/2015 | Loewenstein | ..... | H03M 13/2906 |
| 9,450,613 B2 * | 9/2016 | Kern | .................... | H03M 13/159 |
| 9,524,207 B2 * | 12/2016 | Varanasi | ............ | H03M 13/1535 |
| 10,193,573 B2 * | 1/2019 | Goettfert | ........... | H03M 13/1565 |
| 2009/0154916 A1 | 6/2009 | Huang et al. | | |
| 2012/0117448 A1 | 5/2012 | Kern et al. | | |
| 2014/0136931 A1 | 5/2014 | Nakamura et al. | | |

(Continued)

FOREIGN PATENT DOCUMENTS

WO    2018/045459 A1    3/2018

OTHER PUBLICATIONS

International application No. PCT/CA2020/050724 International Search Report dated Sep. 2, 2020.

(Continued)

*Primary Examiner* — Esaw T Abraham

(57) ABSTRACT

A computer-implemented technique for correcting a data packet having a payload and cyclic redundancy check information provides a list of possible packet errors by algorithmic operations of forcing and cancelling bits at certain positions using a generator polynomial, while maintaining the equivalence relationship with the original syndrome, performed explicitly using arithmetic operations or implicitly using a table representative of such arithmetic operations. Correction can then be implemented using an error chosen from the list.

19 Claims, 17 Drawing Sheets

(56) References Cited

U.S. PATENT DOCUMENTS

2014/0258807 A1* 9/2014 Ward ............... H03M 13/13
714/758
2015/0311920 A1* 10/2015 Wang ............... G06F 11/1012
714/764

OTHER PUBLICATIONS

International application No. PCT/CA2020/050724 Search Strategy dated Sep. 2, 2020.
International application No. PCT/CA2020/050724 Written Opinion of the International Searching Authority dated Sep. 2, 2020.
S. Shukla, et al., "Single Bit Error Correction Implementation in CRC-16 on FPGA" in IEEE International Conference on Field Programmable Technology, Brisbane, Australia, 2004, pp. 319-322.
A. S. Aiswarya et al., "Fixed Latency Serial Transceiver with Single Bit Error Correction on FPGA", 2017 International Conference on trends in Electronics and Informatics (ICEI), May 2017.
Houghton, A. The engineer's error coding handbook Springer Science & Business Media, 2012. Chapters 3 and 5. https://link.springer.com/book/10.1007/978-1-4613-0447-0.
Patentability search materials: Référence Dr. Dobbs. An Algorithm for Error Correcting Cyclic Redundancy Checks. Published Jun. 1, 2003, http://www.drdobbs.com/an-algorithm-for-error-correcting-cyclic/184401662.
Patentability search materials: Is it possible to do rudimentary error correction with CRC? Question asked on Sep. 24, 2010. Answered May 29, 2011, Jan. 9, 2015, Dec. 21, 2011, Jun. 4, 2020. https://stackoverflow.com/questions/3788570/is-it-possible-to-do-rudimentary-error-correction-with-crc.
S. Babaie, et al., "Double Bits Error Correction using CRC Method," in Fifth International Conference on Semantics, Knowledge and Grid, pp. 254-257, Oct. 12-14, 2009.
E. Tsimbalo, et al., "Fix It, Don't Bin It! CRC Error correction in Bluetooth low energy," in Proceedings IEEE 2nd World Forum of Internet Things, pp. 286-290, Dec. 14-16, 2015.
E. Tsimbalo, et al., "CRC Error Correction in IoT Applications," in IEEE Transactions on Industrial Informatics, vol. 13, No. 1, pp. 361-369, Feb. 2017.

* cited by examiner

Figure 17

METHODS AND SYSTEMS FOR BIT ERROR DETERMINATION AND CORRECTION

CROSS-REFERENCE TO RELATED APPLICATIONS

This patent application is a continuation application of International PCT application No. PCT/CA2020/050724 filed May 27, 2020 designating the United States, that claims priority of U.S. provisional patent application Ser. No. 62/853,106 filed May 27, 2019, the contents of which are hereby incorporated by reference.

FIELD

This application relates to identification and correction of transmitted bit errors.

BACKGROUND

In wireless communications, cyclic redundancy checks (CRCs) are widely used in order to enhance communication reliability between a transmitter and a receiver. In fact, CRCs are widely used at different layers of the protocol stack of a data transmission by detecting transmission errors at the receiver. For instance, CRCs are used at the physical layer for protecting the header of the packet and at the Medium Access Control (MAC) layer for protecting the entire packet. In general CRCs are only used to detect if a transmitted packet has bit errors, in which case the erroneous packet is discarded.

CRCs are based upon two main components: the message or data, which we will refer to as the payload, denoted $d(x)$ and a generator polynomial, denoted $g(x)$. The payload is actually the protected bit sequence (e.g. a binary vector) containing the valuable information and which is the part of the data packet to be transmitted that is protected by CRC. The generator polynomial is a constant binary polynomial, which is defined according to the transmission standard used. There exist different generator polynomials, differing by their length and their number of coefficients in order to be adapted to the protected data.

A typical transmission and reception of a data packet protected by CRC follows three main steps. However, other methods of organizing, processing, and validating the information are possible depending on the communication protocol and packet type.

First, at the transmitter, the payload $d(x)$ is first shifted to the left by n positions, where n is the degree of the generator polynomial to produce(x). $x^n$. This result is then divided by the generator polynomial $g(x)$, and the remainder of this division, denoted $r(x)$, is stored.

Second, $r(x)$ is appended to the payload to be sent and occupies the n rightmost positions of the transmitted message. The transmitted message is thus $d(x)$. $x^n + r(x)$ and has a total length of m+n.

Third, at the receiver, the received message is divided by the generator polynomial $g(x)$ in order to check if an error occurred during the transmission. If the message is correct, the remainder of the division by $g(x)$, which is called the computed CRC syndrome $s(x)$, will produce a result of 0 since $r(x)$ has been added to generate an entire multiple of $g(x)$. On the other hand, a non-zero CRC syndrome value will indicate an error in the transmitted message.

In currently used systems and methods, the basic error management of CRCs is to discard a packet as soon as an error is detected at the receiver, that is when the remainder is not equal to zero at the receiver. These approaches do not allow for packets to be corrected. In such systems, a received corrupted packet is processed as a lost packet. For example, although a packet having only a single bit in error and which would be otherwise a good packet, it will be detected as an erroneous packet and will be entirely discarded. Discarding entire packets that have only one or a few errors leads to a loss of a significant amount of valuable information. In specific applications such as real-time video communication, it would be beneficial to extract information from a corrupted packet to enhance the quality of the received stream. Moreover, in severe channel conditions, each recovered packet would lead to a significant increase of the quality of the communication without requiring retransmission. Therefore, repairing lightly corrupted packets can lead to significant quality improvements in video applications or in other applications.

Some previously disclosed systems and methods allow for the correction of corrupted packets. However, these methods may require time-consuming calculations and/or significant amounts of memory. Some of these methods and systems are detailed in PCT Patent Application No. PCT/CA2017/051046 to Coulombe et al., which is incorporated herein by reference. For instance, there is disclosed a method for correcting errors in a group of received packets having one redundant packet. The method relies on determining potential bit error locations according to a checksum pattern and depending on the number of potential bit error locations, the method is capable of identifying the bit locations that are correctable. The identified bit locations are corrected according to information extracted from the checksum or a bit error event which is a classification of checksum pattern types.

Moreover, a state-of-the-art method is proposed by S. Shukla et al. (S. Shukla, N. W. Bergmann, "Single Bit Error Correction Implementation in CRC-16 on FPGA" in *IEEE International Conference on Field Programmable Technology*, Brisbane, Australia, 2004, pp. 319-322). This method implements a lookup table prior to the communication where each entry contains the syndrome corresponding to a specific single error position when using CRC16-CCITT. A search for the received syndrome is performed in the table. If a match is found, the bit at the corresponding position is flipped. The number of entries in the lookup table is based on the size of the expected payload and is constant. This method has been applied to other generator polynomials by A. S. Aiswarya and G. Anu (A. S. Aiswarya and G. Anu, "Fixed Latency Serial Transceiver with Single Bit Error Correction on FPGA", 2017 *International Conference on trends in Electronics and Informatics (ICEI)*, May 2017). Accordingly, there is need for improved systems and methods for identifying and correcting lightly corrupted packets.

SUMMARY

Based on the shortcomings of existing systems and methods for managing errors in CRCs, there is a need for error management systems and methods that identify and correct errors in transmitted data packets. The present disclosure relates to systems and methods that meet these needs.

A computer-implemented method for correcting a data packet having a payload and cyclic redundancy check information provides a list of possible packet errors by algorithmic operations of forcing and cancelling bits at certain positions using a generator polynomial, while maintaining the equivalence relationship with the original syndrome, performed explicitly using arithmetic operations or implicitly using a table representative of such arithmetic operations. Correction can then be implemented using an error chosen from the list.

According to one aspect, there is a computer-implemented method for correcting a data packet. The data packet includes a payload d(x) and cyclic redundancy check (CRC) information. The CRC information is calculated using a generator function or polynomial g(x). The method generates the exhaustive list of potential or valid error vectors or patterns containing N errors or less, denoted $E_N$, by first initializing an error vector e, then determining a number of bits in e that have a value that is indicative of an error, such as a value of '1'. If the number of bits is equal or below a threshold value, denoted N, the method adds the e to the list of potential error vectors $E_N$. Then, the method selects one bit position of the e that has a bit that is indicative of an error such as a bit having a value of '1' as a current position and updates the e to generate an error vector e' by adding a shifted version of g, the binary vector associated with the generator polynomial g(x), to the e at the current position. The method then repeats the steps of determining a number of bits, of adding the e to the list, of selecting one bit position and of updating the e but with respect to e' instead of e. Notice that when repeating steps, the current position is further selected according to previously selected current positions. That is, the current position in each iteration of the repeated steps differs from any previously selected bit position. The steps are repeated until a predetermined condition is met such as until all possible bit positions for updating e have been selected as a current position. Notice that the predetermined condition can also be met when a number of iterations of repeated steps is reached. The method further includes returning the list $E_N$, selecting an error vector e from the list $E_N$ and correcting the packet based on the selected e.

According to one or more embodiments of the method, the error vector e is initialised to [0⊕s], where 0 is a null vector of length m+n, m is the length of the payload, n is the length of the CRC information and s is the computed syndrome.

According to one or more embodiments of the method, the error vector e is initialised to [c⊕s], where c is a vector of length m+n having only bit values that are not indicative of an error such as a valid value, m is the length of the payload, n is the length of the CRC information and s is the computed syndrome According to one or more embodiments of the method, the bit position of e is selected as a current position by selecting the least significant bit, and the current position is incremented at each iteration from the least significant bit to the most significant bit.

According to one or more embodiments of the method, the error vector e is selected from the list $E_N$ by determining which error vector e has the highest probability of being the correct error vector e based on soft information.

According to one or more embodiments of the method the error vector e is selected from the list $E_N$ by selecting the error vector e with a smallest number of bits equal to a value that is indicative of an error such as the value '1'.

According to one or more embodiments of the method, the at least one bit error in the received packet is corrected by eliminating error vectors e from the list $E_N$ according to additional information about the packet.

According to one or more embodiments of the method, the additional information about the packet can be at least one fixed or predictable bit value in the packet. For instance, the additional information may be an IP Version value or a checksum information.

According to one or more embodiments of the method, the error vector e is updated by successively forcing one or more bits of the error vector e to a 1 value.

According to one or more embodiments of the method, the threshold value depends on the number of bits used by the CRC.

According to one or more embodiments of the method, the threshold value depends on the packet size.

According to one or more embodiments of the method, the threshold value does not exceed 3.

According to one or more embodiments of the method, the threshold value is 1 and the method determines when the CRC syndrome vector s contains a single bit having a value indicative of an error (e.g. vector s is equal to a power of 2 when such indicative bit value is '1') and undertakes no bit correction in the received data packet given that the packet length is below the cycle length of the generator polynomial.

According to one or more embodiments of the method, the method determines when $E_N$ indicates a single bit error position and undertakes correction of the single bit error position.

According to one or more embodiments of the method, the method further stores the selected values e in a lookup table and performs a table lookup using the CRC information.

According to another aspect, there is a computer-implemented method for correcting at least one bit error in a received data packet. The received packet has a cyclic redundancy check (CRC) information calculated using a generator polynomial g(x). The method generates a lookup table of error bit vectors associated with CRC syndrome values for all errors of at least one bit error for the generator polynomial g(x). The method further calculates a CRC syndrome value from the received data packet, the CRC information and the generator polynomial g(x). The method also performs a table lookup using the CRC syndrome value as an index to obtain a list of candidate bit error data indicative of one or more possible positions of at least a single bit error associated with the CRC syndrome value. Then the method corrects the at least one bit error in the received packet from the list of candidate bit error data.

According to one or more embodiments, the method corrects at least one bit error in the received packet by eliminating elements from the list of candidate bit error patterns using additional information about the packet.

According to one or more embodiments, the additional information are fixed or predictable bit values in the packet. The additional information may also be an IP Version value or a checksum information.

According to yet another aspect, there is a system having a receiver configured to receive a packet comprising a payload d(x) and cyclic redundancy check (CRC) information, calculated using a generator polynomial g(x). The system also has a processor configured to analyze the packet. The packet is analyzed by determining if an error is present in the packet. If the analysis determines that an error is present, the processor corrects the packet by following the steps of the methods described above.

According to one or more embodiments, the system has a transmitter configured to transmit the packet.

According to one or more embodiments, the system has a memory system configured to store the packet.

According to one or more embodiments, the above-mentioned components of the system are part of a general-purpose computer.

According to one or more embodiments, the system performs one of the following communication protocols: Wi-Fi, Ethernet, Bluetooth, and Bluetooth Low Energy.

According to yet another aspect, there is a computer-implemented method for generating a list of valid error vectors to correct a data packet. The data packet has a payload $d(x)$ and cyclic redundancy check (CRC) information. The CRC information is calculated using a generator polynomial $g(x)$. The method consists of initializing an error vector e. Then determining that the e is a potential error vector according to a number of bits in the e that have a value that is indicative of an error, such as a value of '1'. The method further includes adding e to the list of potential error vectors according to the determining. Then generating an additional error vector e' by adding a shifted version of the generator polynomial vector g (associated to the generator polynomial $g(x)$) to the e at a bit position. Notice that the bit position is determined according to a bit value of the e and according to previously determined bit positions. The method repeats the determining, the adding and the generating for e=e', until a predetermined condition is met.

According to one or more embodiments of the method, the bit value is indicative of an error. For instance, the bit value is '1'.

According to one or more embodiments of the method, the e is determined as a potential error vector when the number of bits is equal or below a threshold value.

According to one or more embodiments of the method, the predetermined condition is met when the number of potential error vectors in the list has reached a predetermined count.

According to one or more embodiments of the method, the predetermined condition is met when the previously determined bit positions comprises all possible bit positions for generating the additional vector e'.

According to one or more embodiments of the method, the bit position differs from the previously determined bit positions.

According to one or more embodiments of the method, initializing the error vector e comprises initializing e to [0⊕s], where 0 is a null vector of length m+n, m is the length of the payload, n is the length of the CRC information and s is the computed syndrome.

According to one or more embodiments of the method, the bit position is further determined according to an incrementation of the bit position from a least significant bit to a most significant bit.

According to one or more embodiments of the method, the method further includes identifying at least one error vector e of the list of potential error vectors as a probable correct error vector according to an information about the packet.

According to one or more embodiments of the method, the method further includes identifying at least one error vector e of the list of potential error vectors as a probable correct error vector according to a number of bits in the at least one error vector e having a value that is indicative of an error.

According to one or more embodiments of the method, the threshold value depends on the number of bits used by the CRC.

According to one or more embodiments of the method, the threshold value depends on the packet size.

According to one or more embodiments of the method, the threshold value does not exceed three.

According to one or more embodiments of the method, the threshold value is one.

According to one or more embodiments of the method, the method further includes storing the probable correct error vector in a lookup table and associating the probable correct error to the CRC information.

According to yet another aspect, there is a system having a receiver and a processor. The receiver is configured to receive a packet comprising a payload $d(x)$ and cyclic redundancy check (CRC) information (i.e. CRC field), calculated using a generator polynomial $g(x)$. The processor is configured to analyze the packet. The packet is analyzed by determining if an error is present in the packet, and if an error is present, the processor generates a list of potential error vectors according the above-mentioned methods. The processor then corrects the received packet according to the generated list.

Other aspects and embodiments of the present disclosure will be described below.

Advantages of the present disclosure will be apparent throughout the description.

BRIEF DESCRIPTION OF THE DRAWINGS

FIGS. 15-17 illustrate a method of identifying error vectors according to the present disclosure.

DETAILED DESCRIPTION

Figure 1:
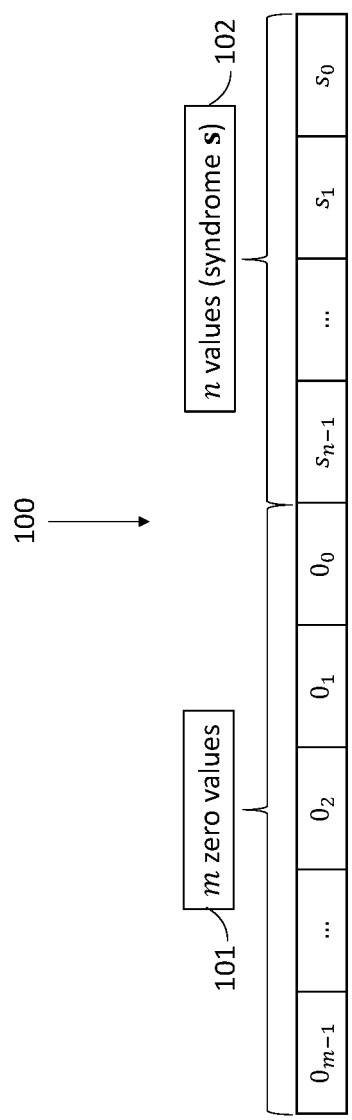
FIG. 1 is an initialized error vector in accordance with the present disclosure.

In general, the present disclosure relates to methods and systems for identifying and correcting errors in data packets received by a receiver. The systems and methods may analyze identified erroneous CRC syndromes to generate lists of potential bit error patterns and may correct a received packet based on one of the potential bit error patterns. The present disclosure will first discuss systems and methods in which the lists are generated using arithmetic operations and then discuss systems in which the lists are generated using lookup tables.

The data packets received by the receiver may be part of a wireless data transmission, including Bluetooth and Wi-Fi data transmission or may be part of any other transmission protocol be it a wireless transmission protocol or a wireline transmission protocol. The packets may also or alternatively be stored in a memory system. For instance, the data packets received by the receiver may be transmitted using CRCs that are used in other types of communications besides wireless, such as fiber optics. They are used in the W3C Portable Network Graphics (PNG) specification to validate the integrity of chunks of data describing an image content. They are also used to validate data integrity in memory components such as Hercules TM570 and RM4 microcontrollers, hard disk drives, optical disks, etc. The present solution does not only detect erroneous packets but is capable of identifying error locations in a packet and correcting the packet. One skilled in the art will recognize that the methods and systems disclosed herein may be used with a variety of applications without departing from the scope of the disclosure.

Throughout the present disclosure, exemplary algorithms are presented to assist with understanding of the methods described herein. In the algorithms presented, sometimes bit operations will be presented while in other cases, polynomial operations will be presented. Someone skilled in the art will know how to perform these operations on binary vectors which actually are a representation of a polynomial. For instance, performing an exclusive OR (XOR) operation between the binary vectors associated with polynomials $e(x)$ and $g(x)$ shifted by k positions to the left and updating $e(x)$ accordingly can be represented as the following: $e \leftarrow e \oplus g << k$. One skilled in the art will recognize that the algorithms presented herein are merely examples, and that the present disclosure may be carried out using different algorithms. In what follows, polynomial vectors are binary representations of their corresponding polynomials. For instance, polynomial vector g is the binary vector corresponding to the generator polynomial $g(x)$. and e is the vector representation of $e(x)$ and s is the vector representation of $s(x)$. To lighten the text, when the context will be clear the term generator polynomial may apply to its vector or polynomial form (g or $g(x)$) and similarly for the terms syndrome and error. For instance, when such terms are mentioned on the context of binary operations, it should be clear that we refer to vector form. Finally, for simplicity, we make the assumption throughout this invention that the bit values at both the MSB and LSB positions of the polynomial vector g are always equal to 1. Someone skilled in the art may adapt the methods described herein when this is not the case.

A skilled person in the art will recognize that the Galois Field $GF(2^k)$ (defined for any integer $k \geq 1$) contains $2^k$ binary vector elements (often referred as binary polynomials), i.e. vectors for which each element value (each bit position value or polynomial coefficient) is either 0 or 1. Each bit in the vector corresponds to the coefficient in the polynomial at the same bit position. The correspondence between binary vector and binary polynomial is well-known. In this field, the addition (+) of two polynomials is performed in modulo 2 for each element without any carry. This is equivalent to performing an exclusive OR (XOR), denoted $\oplus$, between binary vectors to add for each bit position. Therefore, in what follows, when we add two binary vectors together, it actually means performing an XOR operation between them and vice versa.

Arithmetic-Based Corrections

Algorithms disclosed herein may be designed to produce the list of potential bit error patterns (i.e. a list of candidate bit error positions) when an erroneous CRC syndrome is computed on a data packet at the receiver. By erroneous CRC syndrome, we mean a CRC syndrome indicative of an erroneous packet (i.e. non-zero syndrome value). The solutions may not need any previously stored table to work; they may generate the list using arithmetic operations. Furthermore, although using soft bits values and Log Likelihood Ratios (LLRs) can help to order the candidate error positions in the list in terms of likeliness when the list contains multiple elements, the method can also function with only hard bit values. The method can be used to correct multiple isolated errors using only Cyclic Redundancy Check (CRC) syndrome information or CRC syndrome information coupled with other information such as known bit values within the packet or constraints imposed by a checksum.

A key step of proposed methods according to the present disclosure is to list all the possible bit error patterns (set of candidate/possible error positions) for a received erroneous CRC syndrome including any number of errors up to a defined number. The list may contain one or multiple such bit error patterns. A bit error pattern may have the same length as the packet and may indicate possible bit error positions (e.g. a 1 indicates a candidate bit error position and a 0 indicates that the information is correct at that position). When a list contains a single element (single pattern), then the data packet may be corrected with certainty because the element indicates which bits to correct. Correcting a bit may comprise flipping the bit. Otherwise, the method may provide a list of potential error patterns which lead to the same CRC syndrome. In such instances, other information may be used to differentiate among these potential error patterns to identify the actual error pattern which occurred (e.g. known or predictable bit values in the packet) or to rank them in terms of probability of occurrence (e.g. using soft information related to each bit value of the packet). Methods disclosed herein may consider all the possible bit error patterns with a number of bit errors not exceeding a certain value. For instance, the method may be requested to provide all the error patterns not exceeding N erroneous bits, where $N \geq 1$.

In general, methods according to the present disclosure may involve generating a set of potential error vectors (i.e. error vectors which lead to the same syndrome value and thus potentially led to the received packet. In such vectors, the ones indicate all the positions of errors and the zeros indicate valid values). It shall however be understood that in some cases, another value such as a zero value can indicate all the positions of errors and one values can indicate valid values. These methods may include the following steps: (1) initializing an error vector; (2) determining if the error vector includes a valid number of errors; (3) appending the error vector to the set of potential error vectors if it does include a valid number of errors; and (4) generating a new error vector by adding a shifted version of g, the binary vector corresponding to the generator polynomial $g(x)$, or some other binary vector to the current error vector. Step (2) may involve determining whether or not the number of errors indicated by the error vector is less than or equal to a threshold value. Step (4) may be performed using a wide variety of algorithms. Several such algorithms will be described in detail below, but one skilled in the art may readily envision further algorithms. Any algorithm in which a shifted version of a polynomial vector is added to the error vector falls within the scope of the present disclosure. In step (1), the error vector may be initialized based on the algorithm which is selected for step (4).

Methods disclosed herein may take advantage of the cyclic aspect of CRCs in order to find every candidate in an accurate way. The CRC may be defined by the following equation:

$$d(x) \cdot x^n = q(x)g(x) + r(x) \quad (1)$$

where $d(x) \cdot x^n$ is the payload to be received, left shifted by n positions, defined over $GF(2^{m+n})$ where m is the length of the payload and n is the degree of $g(x)$. $r(x)$ represents the remainder of the division, defined over $GF(2^n)$. The transmitted packet, comprising the payload and its associated remainder is denoted $p_T(x)=d(x) \cdot x^n + r(x)$.

If no error occurs during the transmission, the received packet $p_R(x)$ equals the transmitted one $p_T(x)$. The calculation performed at the receiver may produce the following result:

$$[d(x) \cdot x^n + r(x)] \bmod g(x) = 0 \quad (2)$$

If an error occurs during the transmission, the received packet $p_R(x)$ differs from $p_T(x)$, and the error may be expressed as the following equation at the receiver's side:

$$[d(x) \cdot x^n + r(x) + e_a(x)] \bmod g(x) = s(x) \quad (3)$$

where $e_a(x)$ is the actual error pattern that occurred. The method may determine $e_a(x)$ given $s(x)$. But, in general, the bit error patterns $e(x)$ for which Eq. (4) is satisfied are usually not unique.

$$[d(x) \cdot x^n + r(x) + e(x)] \bmod g(x) = s(x) \quad (4)$$

If the set of bit error patterns $e(x)$ for which Eq. (4) is met contains a single element, then it will be $e_a(x)$. Otherwise, a list (set) of candidate error patterns may be obtained and $e_a(x)$ may be part of that list (element of that set). Other information may be used to discriminate $e_a(x)$ from the other elements.

Since the original message modulo $g(x)$ equals zero, Eq. (4) can be simplified as follows:

$$e(x) \bmod g(x) = s(x) \quad (5)$$

where $s(x)$ is the non-null syndrome computed at the receiver.

In some embodiments, the syndrome may be calculated using a different method than that outlined above. For example, a checksum may be calculated based on received data and compared to the transmitted checksum using an exclusive OR (XOR) operation. The result of the calculated checksum XORed with the transmitted checksum may be considered a non-null syndrome. The syndrome calculated by this method or any other method known in the art may be used in the following disclosure as $s(x)$. One skilled in the art will recognize that such variations in the calculations may be advantageous in different situations.

Because a goal of the method is to find the set of all the possible error patterns $E_M$, a more suitable expression equivalent to Eq. (5) may be:

$$E_M = \{e(x) \in GF(2^m) | e(x) = s(x) + q(x)g(x) \forall q(x) \in GF(2^m)\} \quad (6)$$

where $q(x)$ may be any member of $GF(2^m)$, where $GF(2^m)$ is the set of binary vectors of length m, which corresponds to the length of the payload. The set $E_M$ is called the equivalence class containing $s(x)$. Each element is equivalent under the modulo $g(x)$ operation (also denoted mod $g(x)$) since adding any multiple of $g(x)$ to $s(x)$ does not affect the result. It comes with this definition that every value of $q(x)$ will produce a valid error pattern (error polynomial $e(x)$) as long as the result of $s(x) + q(x)g(x)$ doesn't exceed m+n bits, which means that elements in the set $E_M$ resulting from the Eq. (6) can be considered as binary vectors with '1' values at error positions. However, the method may not be interested in every possible bit error pattern. Indeed, the method may focus on correcting packets which are relatively mildly corrupted. Thus, it may be assumed that the bit error rate is low enough so that statistically, few bits will actually be erroneous. The method may be designed to find bit error patterns having no more than N erroneous bits for the computed syndrome $s(x)$, i.e. obtaining the set $E_N$, with $N \geq 1$ being a relatively small value (which depends on the packet size, the number of bits used by the CRC, etc).

Figure 2:
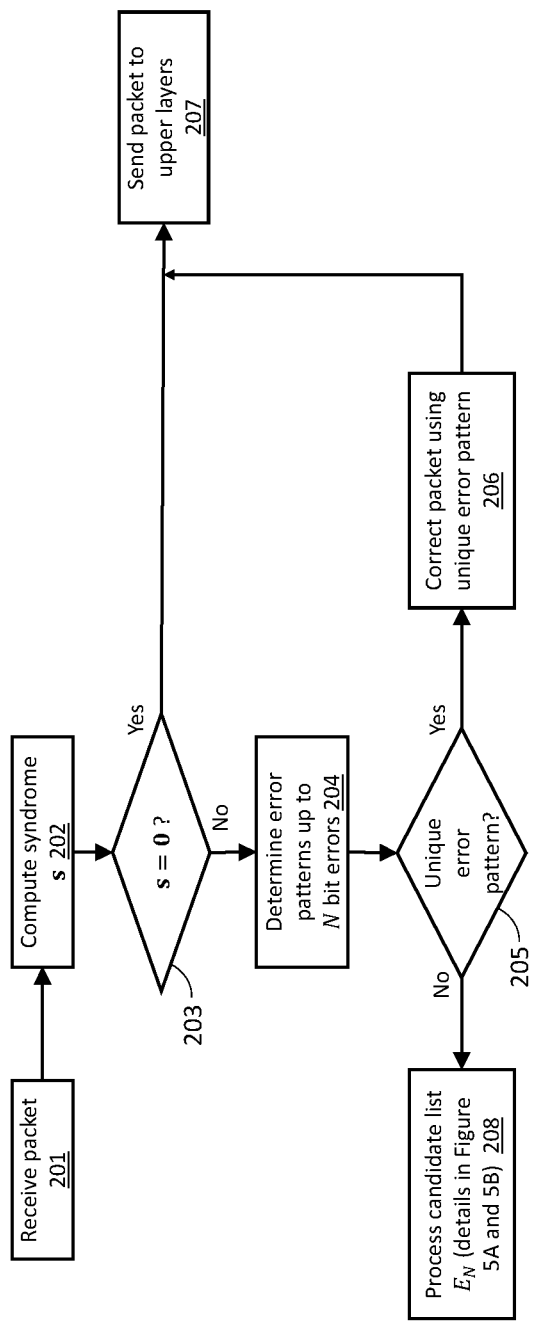
FIGS. 2-11 are flowcharts outlining methods according to the present disclosure.

FIG. 2 illustrates a flowchart outlining the general steps of correcting a packet according to the following methods.

Additional details will be described below with respect to embodiments of the method. The method outlined in FIG. 2 may be performed at a receiver. In step 201, a packet may be received. This packet may include a payload and CRC information. In step 202, the CRC syndrome s may be calculated. This calculation may be performed as described above or using any method known in the art. At branch point 203, it may be determined whether or not s is a null vector. If so, it may be determined that there is no error in the message and the packet may be sent to the upper layers as shown in step 207. If s is not null, potential error patterns including up to a desired number N of erroneous bits may be determined according to step 204. At branch point 205, the potential error patterns may be examined to determine whether or not a unique error pattern has been identified. If one has been, the packet may be corrected based on that error pattern and sent to the upper layers, as shown in steps 206 and 207. If a unique error pattern has not been identified, the list of potential error patterns may be processed to find the most likely error pattern, as shown in step 208. The general method outlined in FIG. 2 may be applicable to the lookup table based methods described below, in addition to the arithmetic based calculations described here.

In order to test every possibility and find every error pattern associated with a computed syndrome $s(x)$, a straightforward approach would be to compute the result of Eq. (6) for all possible values of $q(x)$ (up to a certain degree) and then discard the patterns which contain more than N erroneous bits. However, since there are $2^m$ different polynomials $q(x)$, this approach may not be practical to conduct in real time processing. Accordingly, a faster approach is needed.

The proposed algorithm may optimize the search for error patterns by considering a scanning approach. In order to practically take advantage of the above mathematical definitions, the strategy is to identify the entire set of error patterns with N or less components (errors), i.e. N or less non-zero values in the binary vector e.

To do so, a binary error vector of the length of the payload may be generated and initialized to zero; n values may be appended to the binary error vector. The n values may be replaced by the computed syndrome at the receiver (denoted s). Therefore, the binary error vector e may initially be set to $0 \oplus s$, where 0 is a zero vector of length m+n. The vector produced may be a valid error vector e. Indeed, one of the possible solutions is that the CRC is erroneous at bit positions corresponding to non-zero bit values and the message was correctly transmitted. FIG. 1 illustrates a binary error vector e 100 including m values 101 set to zero and n values 102 set to the value of the syndrome s, where m is the length of the payload and n is the length of the syndrome. In the present embodiments, a bit value of 1 is indicative of an error and a bit value of 0 is not indicative of an error. However a person skilled in the art will recognize that the opposite is also possible and that the error vector e could be initialised to [$c \oplus s$], where c is a vector of length m+n containing only bit values that are not indicative of an error, such as all ones or all zeros depending on the system.

From this initial error vector, any addition of $q(x)g(x) \forall q(x) \in GF(2^m)$ may generate another valid candidate bit error pattern (candidate error vector) because the syndrome s is unaltered. But not all may have a desired number of erroneous bits.

A method according to the present disclosure may be used to identify error patterns having a single erroneous bit or having multiple (but few) erroneous bits. A method for identifying error patterns having a single erroneous bit will be described below, and then expanded to describe how error patterns having multiple erroneous bits may be identified.

The syndrome s(x) may be associated with a single error pattern if and only if there exists q(x) such that:

$$e(x)=s(x)+q(x)\cdot g(x)=x^{P_1} \quad (7)$$

for a certain $0 \leq P_1 < m+n$, where $P_1$ is the position of the single error.

If the syndrome itself possesses only one non-zero value, the position of the single error may be immediately deduced from the initial state of e, represented in FIG. 1. For example, an error at position 1 least significant bit (LSB) wise will produce the following syndrome vector for a CRC with a generator polynomial vector of length 8:

| 0 | 0 | 0 | 0 | 0 | 0 | 1 | 0 |
|---|---|---|---|---|---|---|---|

Otherwise, it may mean that if a single error exists, its position $P_1$ is higher than the degree of s(x) (e.g. $P_1 \geq n$).

In this case, the degree of q(x) may induce the highest degree '1' at position $P_1=[\deg(g(x))+\deg(q(x))+1]$, where deg(a(x)) denotes the degree of a polynomial a(x), i.e. the position of the highest degree non-zero coefficient in the polynomial. Because this position will always correspond to the non-zero value with the highest degree in e(x), the method may cancel every non-zero value of lower degree so that only one non-zero value remains at position $P_1$, therefore yielding a single error at this position. The position $P_1$ is unknown but can be determined by eliminating all other non-zero values. To do so, the algorithm scans the error vector e from LSB to most significant bit (MSB) and cancels each non-zero value by XORing it with g at these particular positions (i.e. the error vector e is XORed with a left shifted version of g) and accumulates the result in the error vector e for the next position until a result containing a single error is obtained. This operation may be equivalent to adding a term (i.e. adding a '1') to q(x) at the targeted position. At each term added, the number of non-zero coefficients in the new accumulated e may be observed and if this number is less or equal to the targeted number of errors, the set of positions of the non-zero coefficients may be added as a valid candidate:

Valid candidate condition: sum(e)≤NbErrors where sum(e) returns the number of non-zero values in vector e.

Figure 3:
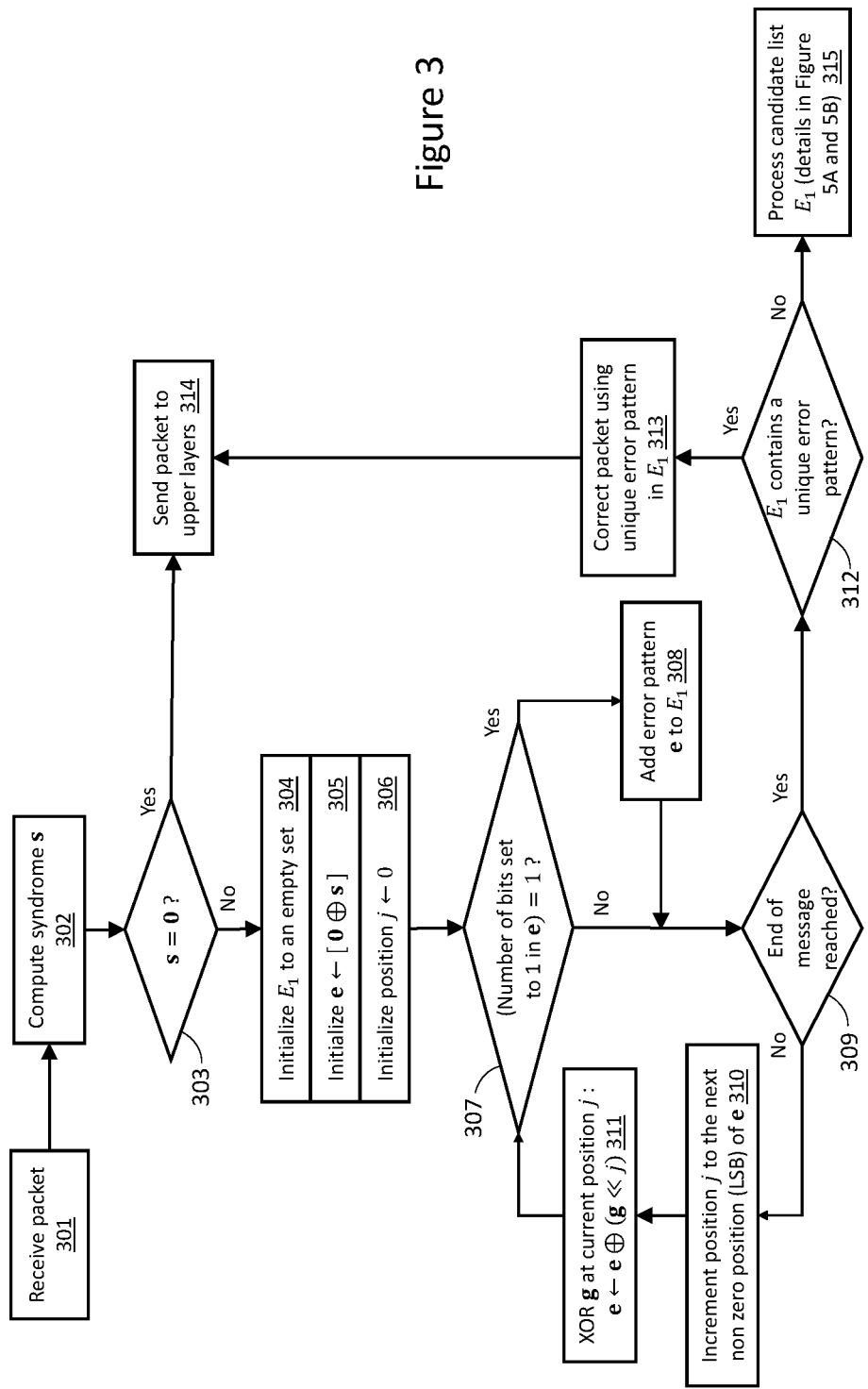

FIG. 3 shows a flowchart outlining this method. The method outlined in FIG. 3 may be performed at a receiver. In step 301, a packet may be received. This packet may include a payload and CRC information. In step 302, the CRC syndrome s may be calculated. This calculation may be performed as described above or using any method known in the art. At branch point 303, it may be determined whether or not s is equal to a null vector (i.e. zero). If it is equal to zero, it may be determined that there is no error in the message and the packet may be sent to the upper layers as shown in step 314. If s is not equal to zero, potential error patterns including one erroneous bit may be determined following steps/branch points 304-311. According to steps 304 to 306, the set of error vectors $E_1$, the initial error vector e and the current position j may be initialized. According to branch point 307, the number of bits set to 1 in e may be determined. If the number of bits set to 1 in e is equal to 1 (i.e. sum(e)=1), the error pattern e may be added to the set $E_1$ as shown in step 308. If the end of the packet has not been reached at step 309, the error pattern e may then be updated according to steps 310 and 311. According to step 310, the current position j may be set to the next non-zero position from the LSB. An XOR operation may be performed between the generator polynomial vector g and the error vector e at the current position and the error vector e may be updated by affecting the result to e, according to step 311. Steps 307-311 may be iterated until the end of the packet is reached. Then, at branch point 312, the set of potential error patterns $E_1$ may be examined to determine whether or not a unique error pattern has been identified. If one has been, the packet may be corrected based on that error pattern and sent to the upper layers, as shown in steps 313 and 314. If a unique error pattern has not been identified, the list of potential error patterns may be processed to find the most likely error pattern, as shown in step 315.

Algorithm 1 presents one embodiment of a method for determining patterns having a single bit error. Algorithm 2 presents an equivalent of Algorithm 1. Both algorithms return the set of valid single error patterns $E_1$. One skilled in the art will recognize that the method described above may also be performed using algorithms other than Algorithm 1 and Algorithm 2.

Throughout this document, all correction algorithms are assumed to be called only when the syndrome is not zero.

---
Algorithm 1
---

SingleErrorCorrection(s, g, n, m)
Inputs:
s: the syndrome vector
g: the vector associated with the generator
polynomial used to compute the CRC
n: the length of the syndrome vector (in bits)
m: the length of the payload (in bits)
Output:
$E_1$: the set of valid error patterns for a single bit error
$E_1$: ← { } // Initialize $E_1$ to an empty set
Let e be a vector of length m + n
e ← 0 ⊕ s // The n-most LSB bits of e are set to s
if sum(e)=1 then
   Add e to $E_1$ // the error was in the CRC at
the bit position where s is non-zero
endif
k ← NZLSB(e) // k is the least significant bit
position of e with non-zero bit value
while( k ≤ m − 1)
   e ← e ⊕ (g << k) // generates 0 at position
k for updated e
   if sum (e)=1 then
     Add e to $E_1$
   endif
   k ← NZLSB(e)
endwhile
Return $E_1$ ---
Algorithm 2
---

SingleErrorCorrection(s, g, n, m)
Inputs:
s: the syndrome vector
g: the vector associated with the generator
polynomial used to compute the CRC
n: the length of the syndrome vector (in bits)
m: the length of the payload (in bits)
Output:
$E_1$: the list of valid error patterns for a single bit error
$E_1$ ← { } // Initialize $E_1$ to an empty set
Let e be a vector of length m + n
e ← 0 ⊕ s // The n-most LSB of e are set to s
if sum(e) = 1 then
   Add e to $E_1$ // the error was in the CRC

Algorithm 2

```
    at the bit position where s is non-zero
  endif
  for j = 0 to m − 1 do
    if e_j = 1 then
        e ← e ⊕ (g << j)
        if sum(e) = 1 then
            Add e to E_1
        endif
    endif
  endfor
  Return E_1
```

Algorithm 1 may work well to identify all the patterns having a single bit error. A first approach to modifying Algorithm 1 to find patterns in the list which possess more than one erroneous bit may be modifying the condition "if sum(e)=1 then" by "if sum(e)≤N then". However, it can be shown that such approach will lead to a partial list of all the possible candidate error patterns having no more than N bit errors. In fact, a main drawback of such approach may be its inability to deal with isolated multiple errors. Isolated errors may be defined as multiple errors occurring at distant positions from each other in the data packet (the distance d separating the lowest and highest degree errors is typically more than the range of g: d>n). For instance, Algorithm 1's elimination process will eliminate errors in LSB positions as we progress making impossible to combine errors in remote LSB and MSB positions. Thus, this approach consisting of cancelling every non-zero value may have a practical length of n, which is the length of g. It may find every solution proposing error patterns where bit errors are within n bits but is unable to identify all error patterns with a distance between bit errors superior to n.

Accordingly, a modified version of the method described above is proposed to deal with isolated errors as well, thus covering all candidate bit error patterns having from 1 to N erroneous bits.

This may be accomplished by forcing error positions upon error vector e during the process. In other words, the search algorithm may perform at each loop the scan with a different fixed erroneous position. For instance, the first loop may define the first position as an error and will thus force a value of '1' at this position. The specified position may not be canceled but may be left as a '1' or even switched to '1' if the original value at the position is '0' by performing a XOR between the error vector e and a shifted version of g at this position. Again, each result is correct because only q(x) is modified throughout the scanning (adding a shifted version of g to the accumulated error vector result), which will always produce a valid solution.

Figure 12:
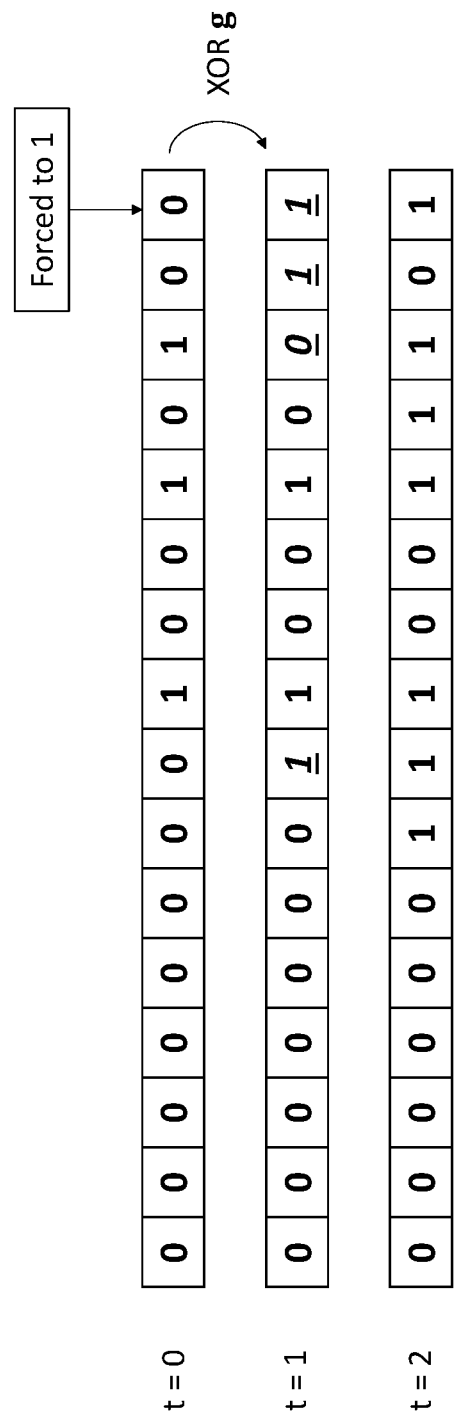
FIG. 12 is an illustration of forcing bits to '1' according to the present disclosure.

FIG. 12 illustrates the principle described above at the first loop of the algorithm (first position forced to 1), applied to data protected by a CRC8-CCITT, where $g(x)=x^8+x^2+x+1$.

As FIG. 12 shows, at t=0, where t is time (or processing step number), a XOR of g (i.e. XOR between e and a shifted version of g at a certain position) may be performed on the first position in order to set it to '1', since it corresponds to the fixed error position of the loop. Once this is done, the algorithm keeps on, cancelling non-zero values at increasing bit positions up to the end of the message and observing at each iteration the total number of non-zero values.

This approach may enable the algorithm to test efficiently every possibility for a given number of errors considered and to store the entire set of possible error patterns associated with the computed syndrome at the receiver.

A similar approach may be used in order to detect every pattern with N errors or less. The difference between the approaches may lie in the number of fixed error positions during the process. For example, the management of every error pattern counting 3 errors or less will require to perform a loop with each possible pair of forced error positions.

Figure 4:
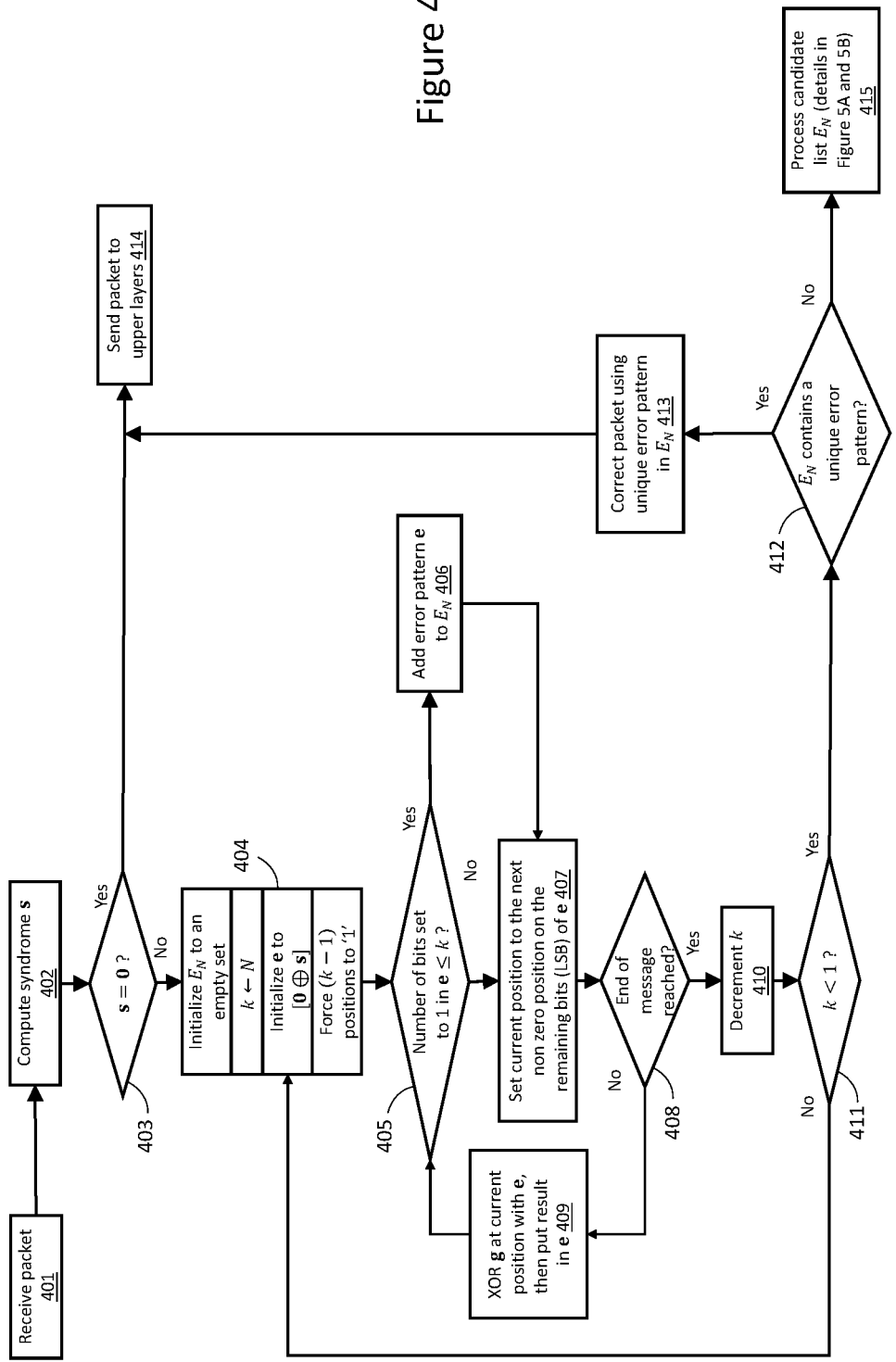

FIG. 4 shows a flowchart outlining this method. The method outlined in FIG. 4 may be performed at a receiver. In step 401, a packet may be received. This packet may include a payload and CRC information. In step 402, the CRC syndrome s may be calculated. This calculation may be performed as described above or using any method known in the art. At branch point 403, it may be determined whether or not s is equal to zero. If it is equal to zero, it may be determined that there is no error in the message and the packet may be sent to the upper layers as shown in step 414. If s is not equal to zero, potential error patterns including one erroneous bit may be determined following steps/branch points 404-411. Steps 405-409 may be iterated until the end of the packet is reached. Then k may be incremented according to step 410. Steps 404-410 may be iterated until k>N. Then, at branch point 412, the set of potential error patterns $E_N$ may be examined to determine whether or not a unique error pattern has been identified. If one has been, the packet may be corrected based on that error pattern and sent to the upper layers, as shown in steps 413 and 414. If a unique error pattern has not been identified, the list of potential error patterns may be processed to find the most likely error pattern, as shown in step 415.

Algorithm 3 presents the determination of patterns having up to N bit errors. It is straightforward to generate the vectors v since there are $$\binom{m+n}{k-1}$$

ways (combinations) of selecting k−1 non-zero bits within a vector of (m+n) bits. Algorithm 4 and Algorithm 5 present equivalents to Algorithm 3. These algorithms return $E_N$, the set of valid error patterns containing up to N bit errors. Algorithm 5 handle the generation of vectors v through an update of the forced position, described in Algorithm 6 and Algorithm 7. One skilled in the art will recognize that the method described above may also be performed using algorithms other than Algorithm 3 to Algorithm 5.

Algorithm 3

```
MultipleBitErrorsPatternsDeterminationV1(s, g, n, m, N)
Inputs:
  s: the syndrome vector
  g: the vector associated with the generator polynomial used to compute
     the CRC
  n: the length of the syndrome vector
  m: the length of the packet
  N: the maximum number of bit errors considered in each pattern
     (assumed to be positive and non-zero)
Output:
  E_N the set of valid error patterns containing up to N bit errors
  E_N ← { }   // Initialize E_N to an empty set
  Let e be a vector of length m + n
  Let v be a vector of length m
  e ← 0 ⊕ s   // The n-most LSB bits of e are set to s
  if sum(e) ≤ N then
```

| Algorithm 3 |
| --- |
| Add e to $E_N$ // bit errors were in the CRC at the positions with non-zero bit values<br>endif<br>k ← N<br>while k ≥ 1 // Test for every nb of forced bits to '1' lower or equal to initial N value<br>    for each possible binary vector v having k-1 non-zero bit values<br>    t ← NZLSB(e) // t ← least significant bit position of e that is non-zero<br>    h ← NZLSB(v) // h ← least significant bit position of v that is non-zero<br>    j ← min(t, h) // The lowest degree to process<br>    while(j ≤ m − 1)<br>        // Change a value of 0 to 1 in e at forced bits positions,<br>    // a value of 1 to 0 at non-forced bit positions and don't process if<br>    // already 1 at forced bit position or already 0 non-forced bit positions.<br>    // Note that $e_j$ is the bit value at position j in e<br>    if $e_j$ ! = $v_j$ then<br>        // update e by modifying bit value at position j<br>        e ← e ⊕ (g << j)<br>        if sum(e) ≤ N then<br>            Add e to $E_N$<br>        endif<br>    endif<br>    $v_j$ ← 0 // cancel v at position j to update NZLSB(v)<br>    t ← NZLSB(e)<br>    h ← NZLSB(v)<br>    j ← min(h, t) // update j<br>    endwhile<br>    endfor<br>k ← k − 1 // Next loop test with one less bit forced position in v<br>e ← 0 ⊕ s // The n-most LSB of e are set to s<br>endwhile<br>Remove duplicate elements in $E_N$<br>Return $E_N$ |

| Algorithm 4 |
| --- |
| MultipleBitErrorsPatternsDeterminationV2(s, g, n, m, N)<br>Inputs:<br>s: the syndrome vector<br>g: the vector associated with the generator polynomial used to compute the CRC<br>n: the length of the syndrome vector<br>m: the length of the payload<br>N: the maximum number of bit errors considered in each pattern (assumed to be positive and non-zero)<br>Output:<br>$E_N$ the set of valid error patterns containing up to N bit errors<br>$E_N$ ← { } // Initialize $E_N$ to an empty set<br>Let e be a vector of length m + n<br>Let v be a vector of length m<br>e ← 0 ⊕ s // The n-most LSB bits of e are set to s<br>if sum(e) ≤ N then<br>    // the bit errors were in the CRC at the positions with non-zero bit values<br>    Add e to $E_N$<br>endif<br>k ← N<br>while k ≥ 1 // Test for every nb of forced bits to '1' lower or equal to initial N value<br>    for each possible vector v having k-1 non-zero bit values<br>        for j = 0 to m − 1<br>    // for all bit positions in the error vector<br>        // Change a value of 0 to 1 in e at forced bits positions,<br>    // a value of 1 to 0 at non-forced bit positions and don't process<br>    // if already 1 at forced bit position or already 0 non-forced bit<br>    // positions.<br>    // Note that $e_j$ is the bit value at position j in e<br>    if $e_j$ ! = $v_j$ then<br>        // update e by modifying bit value at position j<br>        e ← e ⊕ (g << j)<br>        if sum(e) ≤ k then<br>            Add e to $E_N$<br>        endif<br>    endif |

| Algorithm 4 |
| --- |
| endif<br>endfor<br>endfor<br>k ← k − 1 // Next loop test with one less bit forced position in v<br>e ← 0 ⊕ s // The n-most LSB of e are set to s<br>endwhile<br>Remove duplicate elements in $E_N$<br>Return $E_N$ |

| Algorithm 5 |
| --- |
| MultipleBitErrorsPatternsDeterminationV3(s, g, n, m, N)<br>Inputs:<br>s: the syndrome vector<br>g: the vector associated with the generator polynomial used to compute the CRC<br>n: the length of the syndrome vector<br>m: the length of the payload<br>N: the maximum number of bit errors considered in each pattern (assumed to be positive and non-zero)<br>Output:<br>$E_N$ the list of valid error patterns containing up to N bit errors<br>$E_N$ ← { }<br>Let e be a vector of length m + n<br>Let v be a vector of length m<br>e ← 0 ⊕ s // The n-most LSB bits of e are set to s<br>if sum(e) ≤ N then<br>// the bit errors were in the CRC at the positions with non-zero bit values<br>    Add e to $E_N$<br>endif<br>k ← N<br>while k ≥ 1<br>if k = 1 then<br>    Add SingleErrorCorrection(s, g, n, m) to $E_N$ // Result of Algo 1 or 2<br>else<br>    Let $\mathcal{F}$ ← (0, ... ,k-2) // sorted list of (k − 1) LSB positions<br>    v ← PositionsToVector($\mathcal{F}$)<br>    while $\mathcal{F}$ ≠ (m-(k-1), ... ,m-1) do // sorted list of (k − 1) MSB positions<br>        start ← max ($F_1$ − 1, 0)<br>        for j = start to m − 1 do<br>            if $e_j$ ≠ $v_j$ then<br>                e ← e ⊕ (g << j)<br>                if sum(e) ≤ k then<br>                    Add e to $E_N$<br>                endif<br>            endif<br>            if j = $F_1$<br>                e' ← e<br>            endif<br>        endfor<br>        $\mathcal{F}$ ← UpdateForcedPositions($\mathcal{F}$, m)<br>        v ← PositionsToVector($\mathcal{F}$)<br>        e ← e'<br>    endwhile<br>endif<br>e ← 0 ⊕ s<br>k ← k − 1<br>endwhile<br>Remove duplicate elements in $E_N$<br>Return $E_N$ |

| Algorithm 6 |
| --- |
| UpdateForcedPositions($\mathcal{F}$, m)<br>Inputs:<br>$\mathcal{F}$: sorted list ($F_1$, ... , $F_{k-1}$) of (k − 1) bit positions forced to 1, such that $F_i$ < $F_{i+1}$, ∀i<br>m: the length of the payload |

Algorithm 6

```
// Note that k = len(F) + 1, with len(F) the number of elements in the list F
Output:
F': the updated sorted list of forced positions
if F_{k-1} < (m - 1) then
    F_{k-1} ← F_{k-1} + 1
    Return F' ← (F_1, ... , F_{k-1})
else
    for i = k - 2 to 1 do
        if F_i < F_{i+1} - 1 then
            F_i ← F_i + 1
            j ← i
            while j < k - 1 do
                F_{j+1} ← F_j + 1
                j ← j + 1
            endwhile
            Return F' ← (F_1, ... , F_{k-1})
        endif
    endfor
endif
```

Algorithm 7

```
PositionsToVector(F)
Inputs:
F: sorted list (F_1, ... , F_{k-1}) of (k - 1) bit positions forced to 1, such that
F_i < F_{i+1}, ∀i
// Note that k = len(F) + 1, with len(F) the number of elements in the list F
Output:
v: the corresponding vector of forced positions
v ← 0
for i = 1 to k - 1 do
    v_{F_i} ← 1
endfor
Return v
```

The algorithms 3, 4 and 5 described above involve important steps. They successively search for all patterns with k bit errors, for each value of k where $1 \leq k \leq N$. Doing so, for each value of k, they successively force a value of 1 at k−1 bit positions, for all possible sets of k−1 bit positions within the m+n possible positions. For each such set, this forcing a value is performed by successively (from LSB to MSB) adding (i.e. XORing) the current vector e with vector g shifted at the forced positions where the value in e is not 1 and at the non-forced positions where the value in e is not 0. After each said position, from LSB to MSB, is considered, vector e is updated with the result of such addition. For each such set of forced bit positions, the process can be viewed as a cancellation process guided by the forced positions. Before the higher-level process is started for a new value of k and after each set of forced positions is treated, vector e is reinitialized to s. Throughout the process, when a pattern having no more than N bit errors is identified (i.e. sum(e) $\leq N$), it is added to the set of valid error patterns, $E_N$. Starting from positions higher than the MSB forced position Algorithm 5 is an optimized version of algorithms 3 and 4. Indeed, it reduces the number of computations by storing the value of vector e at a specific step of the processing of a set of forced positions and recalling it when processing the next set of forced positions, thus avoiding numerous additions with shifted values of g at various positions. It is possible to accomplish the same outcome by incrementing from the MSB to the LSB. An exemplary method for single error correction which does so is described below.

As detailed above, the error patterns e(x) corresponding to an erroneous received CRC syndrome s(x) for a given generator polynomial g(x) can be expressed as:

$$e(x) = s(x) + q(x)g(x) \forall q(x) \in GF(2^m) \quad (8)$$

where q(x) may be any member of $GF(2^m)$, where $GF(2^m)$ is the set of binary vectors of length m, the length of the payload. Since the number of possible values for q(x) is high ($2^m$ possibilities), we proposed an algorithm to consider only relevant values of q(x), i.e. those producing an error vector e with N errors or less. The algorithm is based on successively adding terms to q(x) by the cancellation of non-zero values in the error vector e from LSB to MSB.

Several algorithms can be derived to build q(x). For example, we can decide to eliminate non-zero values from MSB to LSB instead of the current LSB to MSB process. The process lies on the same method and differs only on the positions and number of forced bit positions (i.e. bits forced to the state '1' during the process). In the next paragraphs, we detail each step with an example.

Figure 14:
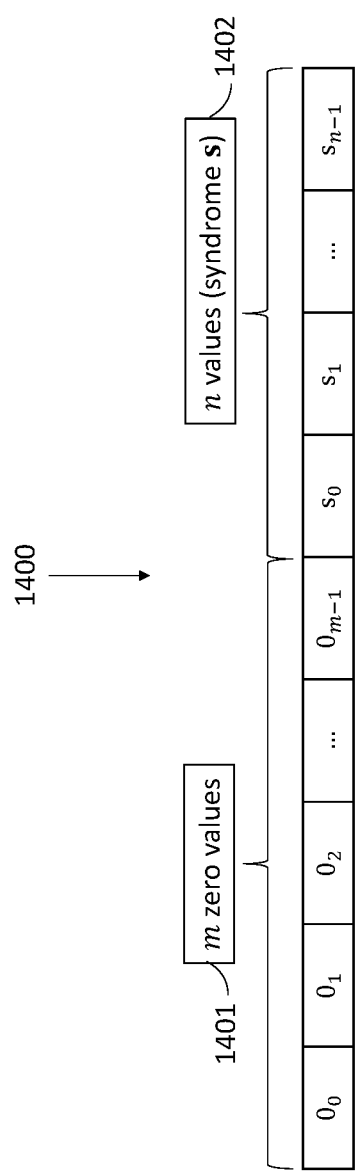
FIG. 14 is an initialized error vector in accordance with another embodiment of the present disclosure.

The initial state of the error vector e corresponds to m zero values (m corresponding to the number of data bits protected by the CRC field) followed by n values equal to the syndrome computed at the receiver, as illustrated in FIG. 14.

Figure 15:
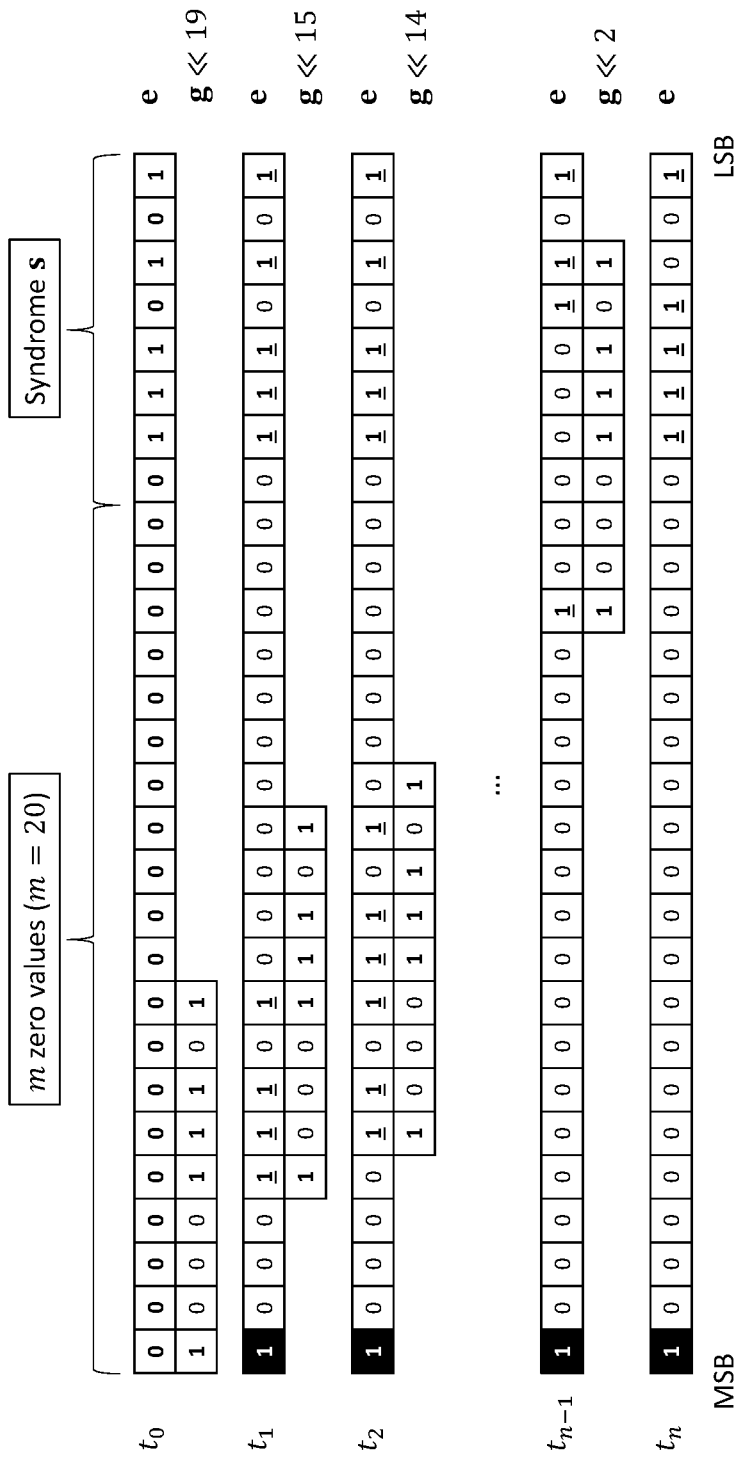

At the first iteration, the MSB of e must be forced to '1' by XORing it with a left-shifted version of g at the correct position. Then, the elimination process goes on from MSB to LSB, leaving the forced bit to '1' at MSB position and updating the error vector e at each step, as represented in FIG. 15. If during the process the current error vector contains 1 error (at the forced position), it is added to the set of valid error patterns.

FIG. 15 is an example of the first iteration of such method, applied to a CRC8-CCITT of generator polynomial $g(x) = x^8 + x^4 + x^3 + x^2 + 1$, protecting a payload of 20 bits. The syndrome s considered corresponds to a single error located at position $P_1 = x^{21}$. In this figure, black cells represent the forced bit position and dark grey cells the non-zero values to be cancelled through the process. At each step, the MSB value to cancel (i.e. the leftmost dark grey cell) is eliminated by XORing it with a left shifted version of g, so that the highest degree term of g corresponds to the position to cancel.

Figure 16:
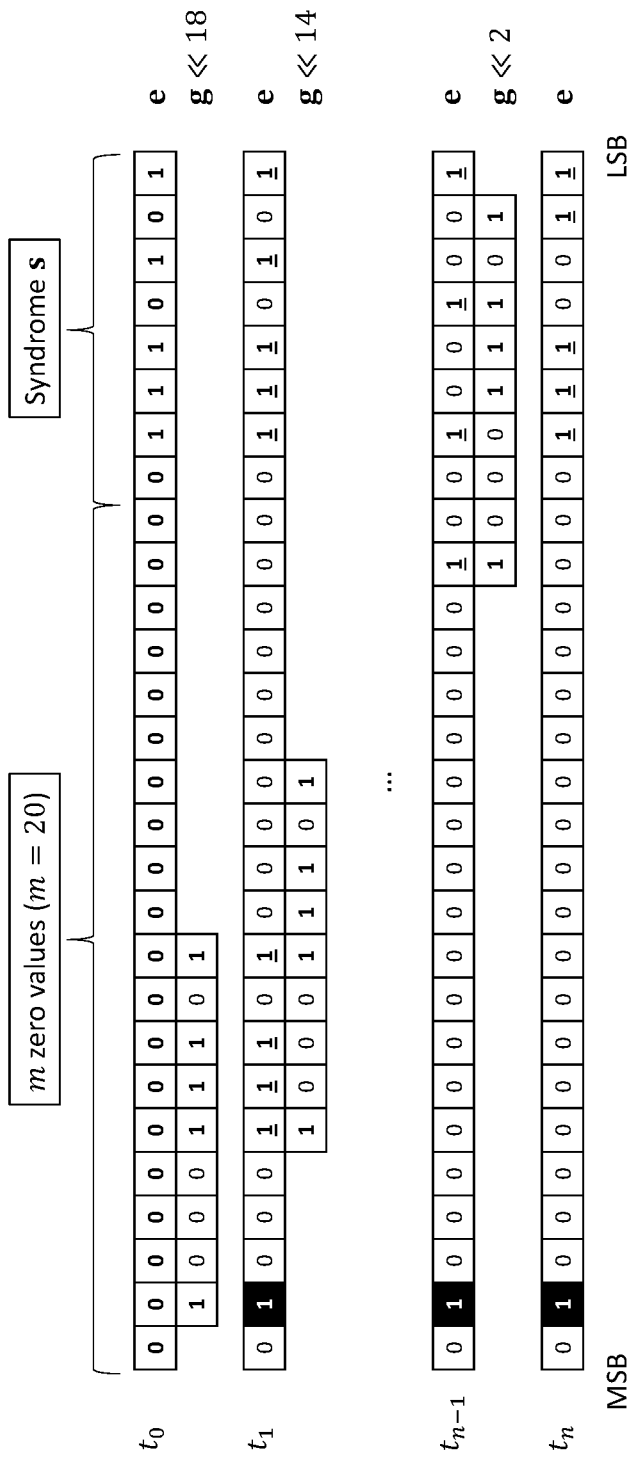

When the first iteration ends (i.e. time $t_n$ is reached in FIG. 15), we recall the initial state of e and force the second MSB position to '1', using the same process. FIG. 16 summarizes such process, using the same example as FIG. 15.

Figure 17:
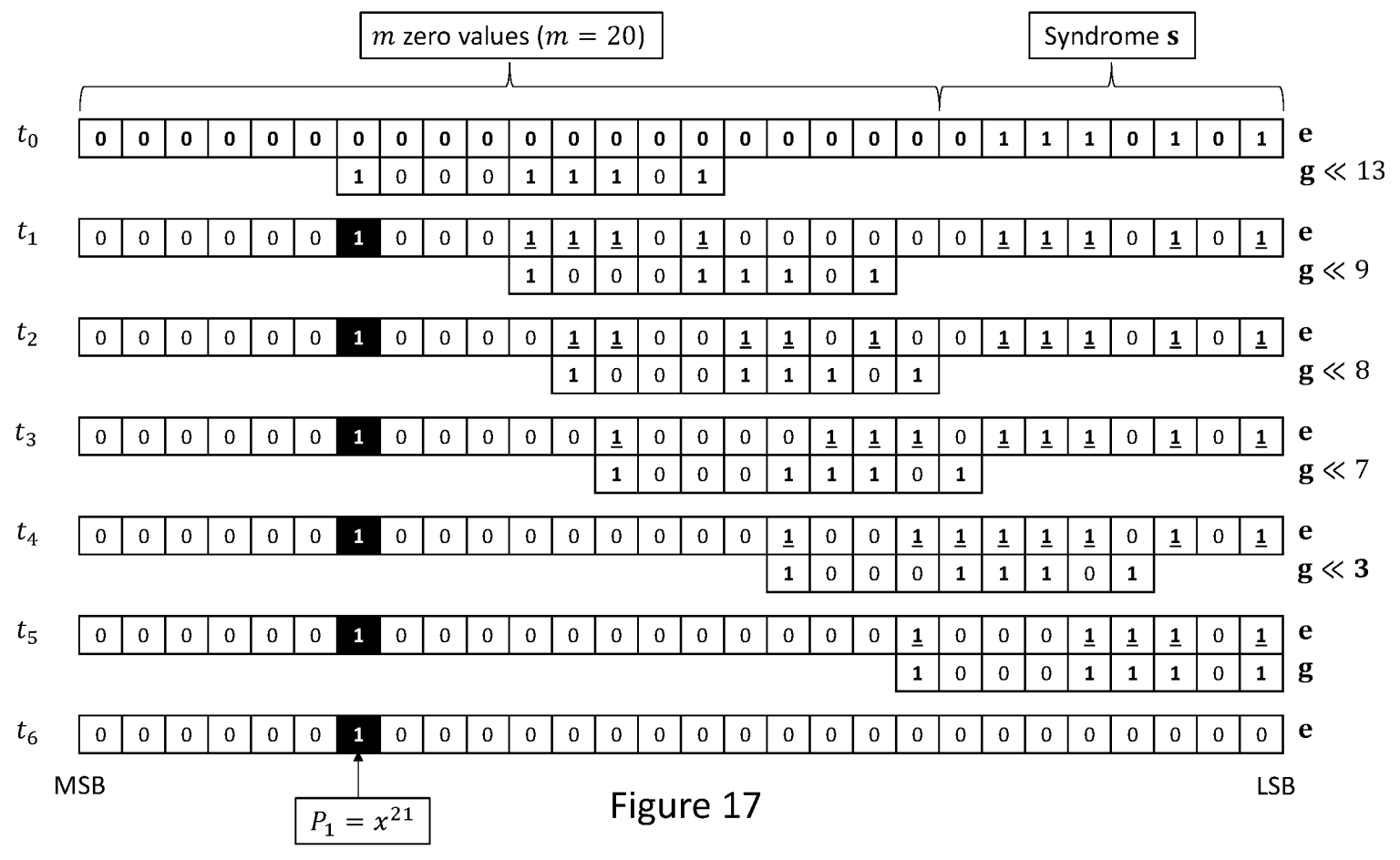

If the forced bit position is the only non-zero value remaining in e during or at the end of the process, then a single error pattern is appended to the list, corresponding to an error at the forced position. FIG. 17 represent such iteration, based on the example from FIG. 15.

At time $t_6$ in FIG. 17, every non-zero value has been cancelled and only one position remains to the state '1', indicating that a single error pattern corresponds to the erroneous position $x^{21}$.

In order to handle multiple error patterns containing N errors, the same process is conducted, while forcing N positions to '1' in the error vector e. Through the process, all the possible error patterns containing N errors are tested.

This version of the algorithm is less efficient than the LSB to MSB version currently proposed in the specs. In terms of computational complexity, the MSB to LSB version must test all the combinations of N forced positions to find the set of N-errors candidates. The LSB to MSB version only needs to test the combinations of N−1 errors (see Algorithm 3).

As discussed above, one skilled in the art will recognize that other embodiments are also possible without departing from the scope of the present invention. For instance, although the methods discussed herein target cyclic redundancy check (CRC) and its generator polynomial, the method may work with other redundancy information. Someone skilled in the art will know in which cases the invention can be applied. We also use '1' to identify the errors in the error vector and to identify the forced positions but someone skilled in the art could derive other methods where '0' are used instead in one or both of these vectors or other vectors presented in this invention and adapting the processes to make them functional without departing from the ideas of this invention. Similarly, vectors have been used to illustrate the method, but other algorithmic or mathematic structures or representations may be used to achieve the same result.

Figure 5A:
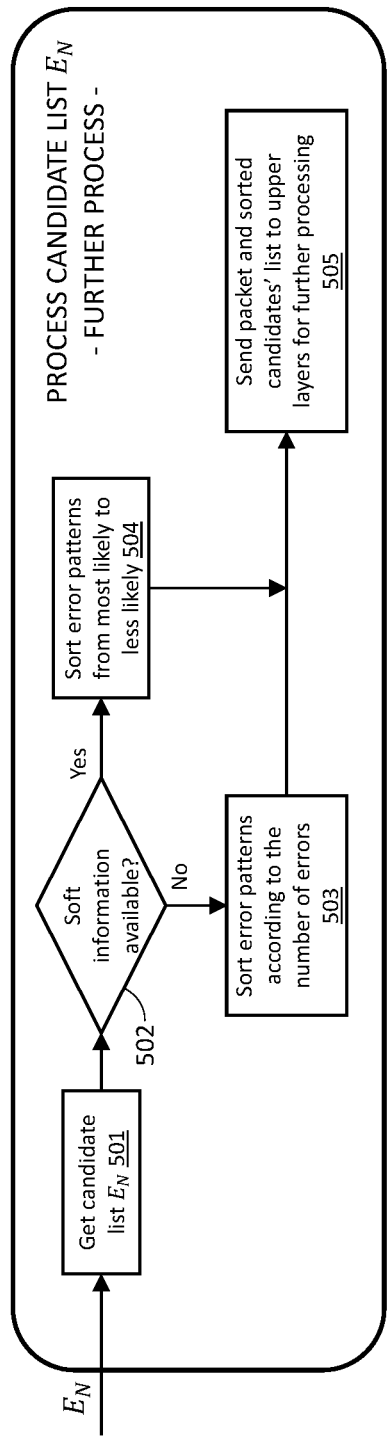
Figure 5B:
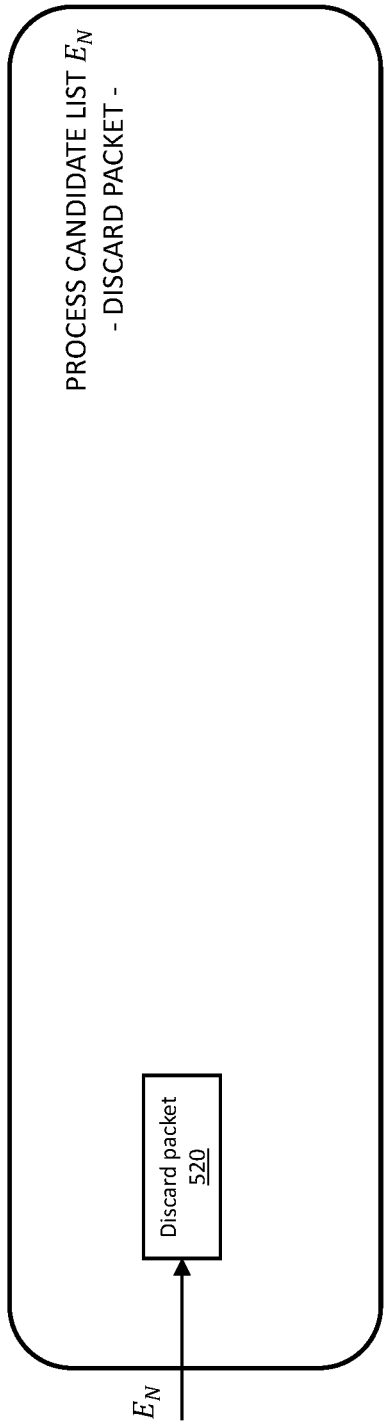

As discussed above, further processing may be performed on the set of potential error patterns $E_N$ returned by the methods described above if $E_N$ contains more than one potential error pattern. FIGS. 5A-5B illustrate methods of processing the set $E_N$. As shown in FIG. 5A, the set $E_N$ may be received in step 501. At branch point 502, it may be determined if soft information is available. If soft information is available, the error patterns may be sorted from most likely to least likely according to this information in step 504. If soft information is not available, the error patterns may be sorted according to the number of erroneous bits they indicate in step 503. In some embodiments, patterns containing fewer erroneous bits may be more likely. The packet and the most likely error pattern may be sent to upper layers in step 505. As shown in FIG. 5B, an alternative processing method is to simply discard the packet according to step 520.

The arithmetic-based methods disclosed herein may have numerous advantages over the prior art methods. These advantages have been discussed throughout the disclosure, but will be enumerated here for clarity.

The methods discussed above may be very flexible, since the computational complexity may be set by the maximum number of errors that the receiver wishes to consider. This parameter can be constant or can be modified to meet the channel conditions, as a trade-off between computational resources and number of errors considered. The number of errors also depends on the CRC length, as larger CRC lengths allow the correction of more bits.

The flexibility of these methods is also insured by their ability to deal with every possible polynomial generator, which is not the case of lookup table approaches common in the prior art. In those approaches, the syndromes for one specific generator polynomial are stored and thus a different table is needed for each generator polynomial.

Another advantageous aspect of the proposed algorithms may be their ability to be conducted on payloads of any length. The length of the payload will cost more computational resources but will not impact the accuracy of the result of our algorithm. Table-based approaches are closely linked to the length of the payload since they are implemented for a specific maximum length, which corresponds to the number of entries in the table. If the packet is longer and an error occurs in a position higher than the maximum length, it will not be detected or corrected by table-based approaches.

Examples of typical use of the methods discussed above will now be described. These examples are not exhaustive, and other uses of the methods disclosed herein are possible and anticipated. By producing the entire list of error patterns up to N errors, our algorithm is designed to be used with additional processes in order to enhance the global error correction capacity of the method. First, methods disclosed herein can be used in addition to constant or predictable fields information within the packet (i.e. the IP Version value in an IP packet header in an IPV4 network). The packets protected by the CRC often possess constant fields that can be used to invalidate candidates from the list. For example, packet headers are often protected by a CRC and some fields such as the protocol version and reserved bits are known to the receiver since they are constant. If these constant values disagree with some error patterns from the list, they can be deleted (removed from the list) to reduce the number of possibilities. The same can be achieved with field values that can be predicted. For instance, in RTP packets, Sequence numbers increase by one for each RTP packet transmitted, timestamps increase by the time "covered" by a packet. In some embodiments, predictable values may include one or more of the following: IP Version value in an IP packet header, RTP Version, Payload Type, Marker, Timestamp and Sequence Number in an RTP packet, Service fields, Reserved bits, Sounding packet indicator, and Tail bits.

Another approach may be to use the list produced by our algorithm as a hint to upper layers' error management. For example, some methods allow erroneous UDP Checksums to produce an error patterns' list as well (see [5]). By combining the information of these two lists, we can only select the candidates that match both lists in order to reduce greatly the number of possibilities and even end up with a single candidate which corresponds to the actual bit error pattern.

Algorithms disclosed herein can also be used as a stand-alone process. The error correction capacity will be lower than the combined approaches listed above but still allows better performances than other methods. The algorithm can be used alone in particular cases when there is only one candidate in the final list. In such cases, the erroneous positions can be flipped immediately. However, the percentage of actual error patterns which lead to a single candidate at the end of the process naturally decreases with the number of errors considered but can still be useful up to 3 errors and sometimes more. The following table illustrates this principle by showing the percentage of single candidate lists over all possible error positions for a certain number of errors considered, applied to a CRC16-CCITT protecting 32 information bits:

| Number of errors | 1 | 2 | 3 | 4 |
|---|---|---|---|---|
| Single candidate list ratio | 100% | 74.5% | 35.9% | 9.7% |

This table means that in this particular configuration, 74.5% of the possible 2-errors patterns will produce a one-candidate list at the end of the process, i.e. the errors positions can be determined immediately in 74.5% of the possible cases.

The method can be applied to the transmission of any type of data including audio and video. In the case of video, candidate error patterns can also be validated using a video decoder. However, correcting other type of data should be considered with care; especially when sensitive (e.g. where inaccurate correction is more damaging than discarding the packet).

The performance of the arithmetic-based methods disclosed above are now discussed. Specifically, the performances of present algorithms are compared to other CRC-based methods using hard information to correct errors and it comes that the proposed algorithm does not need to store lookup tables at the receiver's side, reducing the memory costs at the decoder and allowing the flexibility mentioned in the previous section. Only arithmetic operations are required in the proposed method.

The percentage of correctible patterns tend to decrease a lot as the difference between the number of targeted errors and the number of searched errors increases. However, it can be noted that from three targeted errors, it can be useful to search for one or more errors since the percentages are high and it could save a significant part of the computation.

Finally, the number of errors in constant or predictable fields can be used to estimate the bit error rate and decide if we should apply the correction method or not, i.e. if the hypothesis that the packet is mildly corrupted holds. Other means could also be used to make this decision such as information from the physical layer (signal strength, signal to noise ratio, reliability of soft information, etc.).

The method described does not require to store data at the receiver to retrieve error positions. This is made possible thank to arithmetic operations on the received syndrome. Such arithmetic operations are repetitive to conduct a thorough search for error patterns. When storage is not a constraint, one would gain significant complexity by storing the result of arithmetic operations in a table sorted such that the result can be accessed instantly.

Table-Based Corrections

As discussed above, the present disclosure also relates to algorithms which use tables and which are designed to produce the list of potential bit error patterns (i.e. a list of candidate bit error positions) when an erroneous Cyclic Redundancy Check (CRC) syndrome is computed on a data packet at the receiver.

While the method discussed above generates the list using arithmetic operations, the method outlined here does it by using tables and accordingly avoiding most arithmetic operations. Unlike prior art where tables are sparse and contain error positions only for cyclic redundancy check (CRC) syndromes compatible with a certain packet size (e.g. that associated with a standard), the proposed tables provide error positions for every possible CRC syndrome value. In addition to being usable for any packet size, those tables can be indexed directly by CRC syndrome value instead of being searched in a table as in the prior art. Indeed, the process of searching for a pattern in a table, as in the prior art, is computationally intensive. This method thus provides enhanced speed performance at the cost of higher memory requirement.

The previous method achieves CRC syndrome simplification through successive additions (XORs) of the current error (initialized to the computed syndrome) with shifted versions of the generator polynomial and updating the error vector with the result of the addition until a single error appears (it should be clear from the context that we are referring to vectors). In this method, we propose to avoid these computations by storing in a table the location (relative distance) of the single error corresponding to each CRC syndrome value. Because the table may be directly indexed by those CRC syndrome values, the error location may be directly accessed by using the CRC syndrome as an index in the table. When the error is located outside the packet, then it means that the packet is not corrupted by a single error but contains more than one error. Also, when an error is occurring at position '$P_1$' then it occurs as well as position '$P_1+k*T$' for positive k values and T being the repetition period associated to the generator polynomial (e.g. T=32768 for CCITT CRC-16). Note that this method considers a generator polynomial vector for which the bit at position 0 is set to 1 (its LSB is 1). This is typically the case for generator polynomials found in standards. The ideas in this invention could still be applied or adapted to other generator polynomials by performing right shifts until their LSB is 1.

For two errors, the strategy may be to place a first error and then search for the second using a single error management. The single error management is straightforward. First it checks the (calculated) syndrome and its associated relative distance and determines if the error occurs within the packet. For two errors, a first least significant bit (LSB) error is placed (i.e. the corresponding bit is either left to a '1' or forced to '1' if it was a '0' by XORing g at this position) then the single error management is performed on the remaining length of the packet. By forcing a first error at a specific position, the resulting syndrome is expected to correspond to a single error syndrome. Checking the position of this error by conducting the single error method will indicate if this second error at position '$P_1$' (as well as the other single error positions at positions '$P_1+k*T$' if the packet is sufficiently large) occurs within the packet which would lead to a new candidate error pattern with errors at positions ($P_1+1+F_1$) and $F_1$, where $F_1$ is the position of the forced error. Thus, to consider the entire set of possibilities, the single error management has to be called for each possible location of the first error. At the end of each verification, the LSB error is moved by one bit toward the most significant bit (MSB), from LSB position where $F_1=0$ to the end of the payload at position $F_1=m-1$. This displacement is conducted into two steps:

(1) The previous bit position tested (former $F_1$, forced to '1') is set to '0' by XORing g at this position; and (2) The following bit toward the MSB is considered as the new first error (i.e. $F_1 \leftarrow F_1+1$) and is either left to a '1' if it was a '1' or forced to '1' by XORing g at this position if it was a '0'.

The process may be repeated until the forced bit position reaches the position m, corresponding to the length of the protected data (position m−1 is the last position processed).

According to these steps, the sequence of syndromes may always be the same and thus it is proposed in this method to store the value of the next syndrome based on the current one. More specifically, the next element for a given syndrome s is (f⊕g)>>1 if the LSB of f is 0 and f>>1 otherwise. In this context, f=[((s<<1)⊕1)⊕g]>>1. Linking a syndrome to the next will significantly reduce the complexity of the approach since the arithmetic operations will be pre-computed and stored into the reference table.

For N errors, the generalization of the strategy used for two errors case is conducted. N−2 bits must be forced to '1' at each step (initialized to the N−2 LSBs of the syndrome) and the two errors method is performed on the remaining bits of the packet. For each forced bit error position (from the two errors approach that remains after forcing the N−2 bits), the next element (step by 1 bit toward MSB) can be accessed from the reference table to reduce computational complexity and avoid arithmetic operations. Therefore, we look at every possible combination of forcing N−2 bits to 1 within the m−1 first bits (LSB) of the packet. Let the forced bits be at positions $F_1, F_2, \ldots, F_{N-2}$ with $F_1<F_2<\ldots<F_{N-2}$ (sorted by increasing bit position). Forcing some bits to 1 means that the bits at positions $F_1, F_2, \ldots, F_{N-2}$ are set to 1 and the other bit positions below position $F_{N-2}$ are set to 0. With this definition, it can be observed that all the bits with a position below $F_{N-2}$ are actually forced, whether they are forced to the value '0' or '1'. However, in this approach we refer as "forced bits" the positions forced to '1', representing the N−2 errors placed. But it is to be understood that when a bit within the range of forced bit positions is not forced to 1, then it is forced to 0. More generally, we focus on the positions forced to 1 because the algorithm strives to set to 0 the other positions during its elimination process. Starting with the CRC syndrome, this must be done through the successive addition of left-shifted versions of the generator polynomial vector and accumulation of the results in order to obtain the desired result (it is not possible to simply ignore the CRC syndrome and fix bits at desired positions, we need to maintain the equivalence relationship with the original CRC syndrome, i.e. only add to it shifted versions of g). This may be done by starting at bit 0 of the CRC syndrome and if its value is the desired value then we do nothing for that position. If the value is not what is desired, then g may be added at that position (i.e. perform XOR) which contains a 1 at its LSB to modify it. As the method processes successively the next positions from LSB (bit 0) to MSB (bit $F_{N-2}$) in that similar manner, it is important that each time we add g at the current position (i.e. left-shift g by r bits prior to addition when processing position r) and update the syndrome value (by keeping it or replacing it by its addition with properly shifted version of g depending if the value at the position remained or was modified), until we have set the MSB that we want to set to 1 within the N−2 forced bits (i.e. until we have processed position $F_{N-2}$). From there, the process described for two errors may be applied.

The reference table may thus only contain the relative distance to the single error to deal with single error cases. However, in order to handle multiple errors occurring in the packet, the reference table should also contain the value of the next element for every syndrome. This allows the method to bypass arithmetic operations on the fly by pre-computing these values.

The relative distance stored in the table may be used as is in the context of single error management. When several errors are handled, the total distance to be compared with the length of the packet is the relative distance obtained from the table in addition to the leftmost position of the forced bit position.

Indeed, let the forced bits be at positions $F_1, F_2, \ldots, F_{N-2}$ with $F_1 < F_2 < \ldots < F_{N-2}$ (sorted by increasing bit position), $F_{N-1}$ the position of the (N−1)-th error and $P_1$ be the relative distance obtained from the table (the positions $F_{N-1}$ and $P_1$ constitute the positions associated with the two errors approach). Then, the total distance to be compared with the length of the packet is $(P_1 + F_{N-1} + 1)$. If the total distance doesn't allow an error within the packet, then other candidates are tested as will explained later in this document.

To generate the reference table, the single error position given the computed syndrome must be known. The following algorithm is designed to identify the single error position associated to a given syndrome based on arithmetic operations. This algorithm cancels the non-zero least significant bit (NZLSB) term (i.e. the least significant bit position with a non-zero value at such position) at each step by adding a shifted version of g at this specific position. This process continues until only one non-zero term remains, corresponding to the single error position for this syndrome. Note that throughout this document, by syndrome, we mean computed CRC syndrome.

Figure 6:
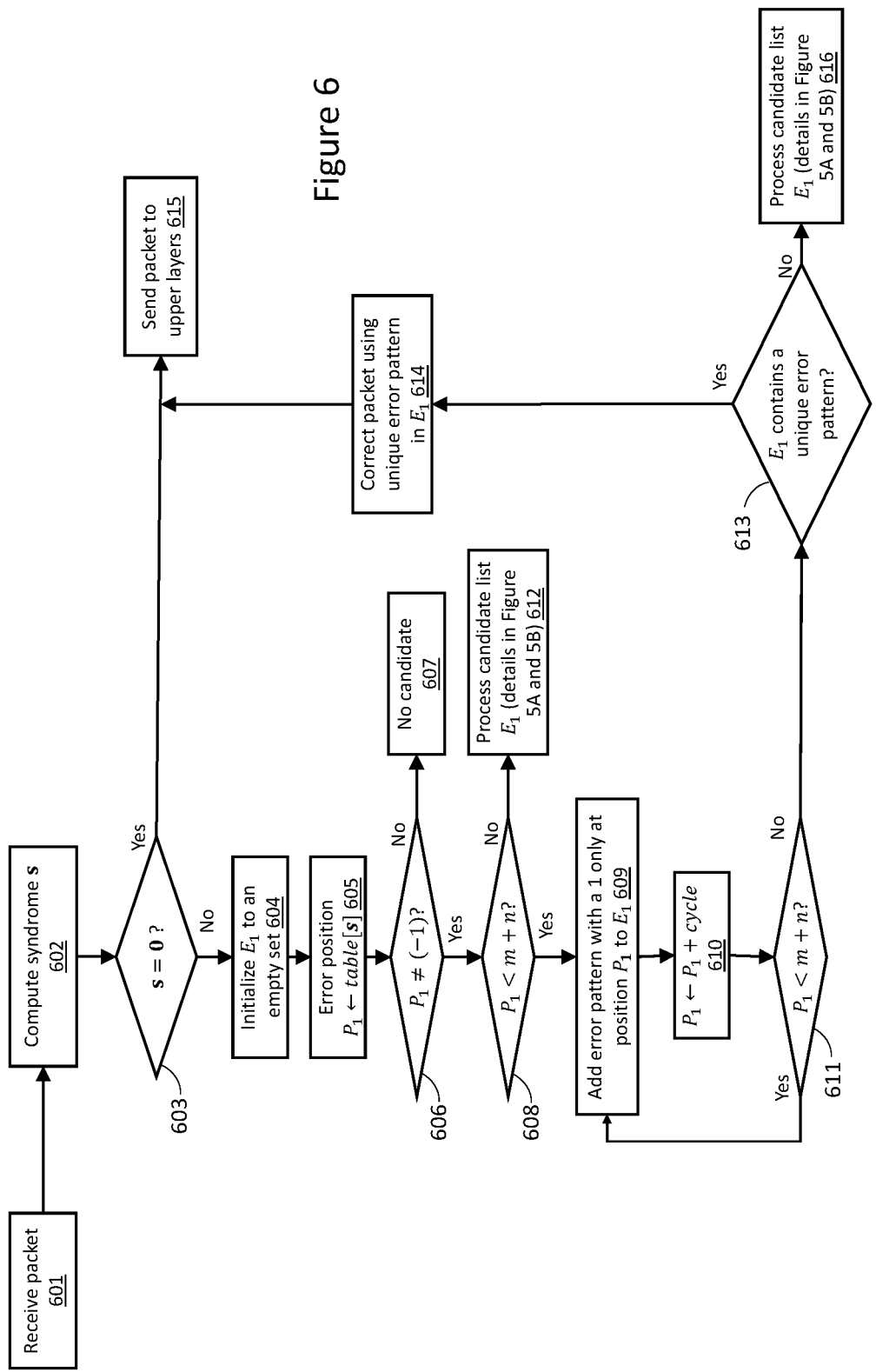

FIG. 6 shows a flowchart outlining this method. The method outlined in FIG. 6 may be performed at a receiver. In step 601, a packet may be received. This packet may include a payload and CRC information. In step 602, the CRC syndrome s may be calculated. This calculation may be performed as described above or using any method known in the art. At branch point 603, it may be determined whether or not s is equal to zero. If it is equal to zero, it may be determined that there is no error in the message and the packet may be sent to the upper layers as shown in step 615. If s is not equal to zero, potential error patterns including one erroneous bit may be determined following steps/branch points 604-612, which may be iterated while $P_1 < m+n$. Then, at branch point 613, the set of potential error patterns $E_1$ may be examined to determine whether or not a unique error pattern has been identified. If one has been, the packet may be corrected based on that error pattern and sent to the upper layers, as shown in steps 614 and 615. If a unique error pattern has not been identified, the list of potential error patterns may be processed to find the most likely error pattern, as shown in step 616.

Figure 10:
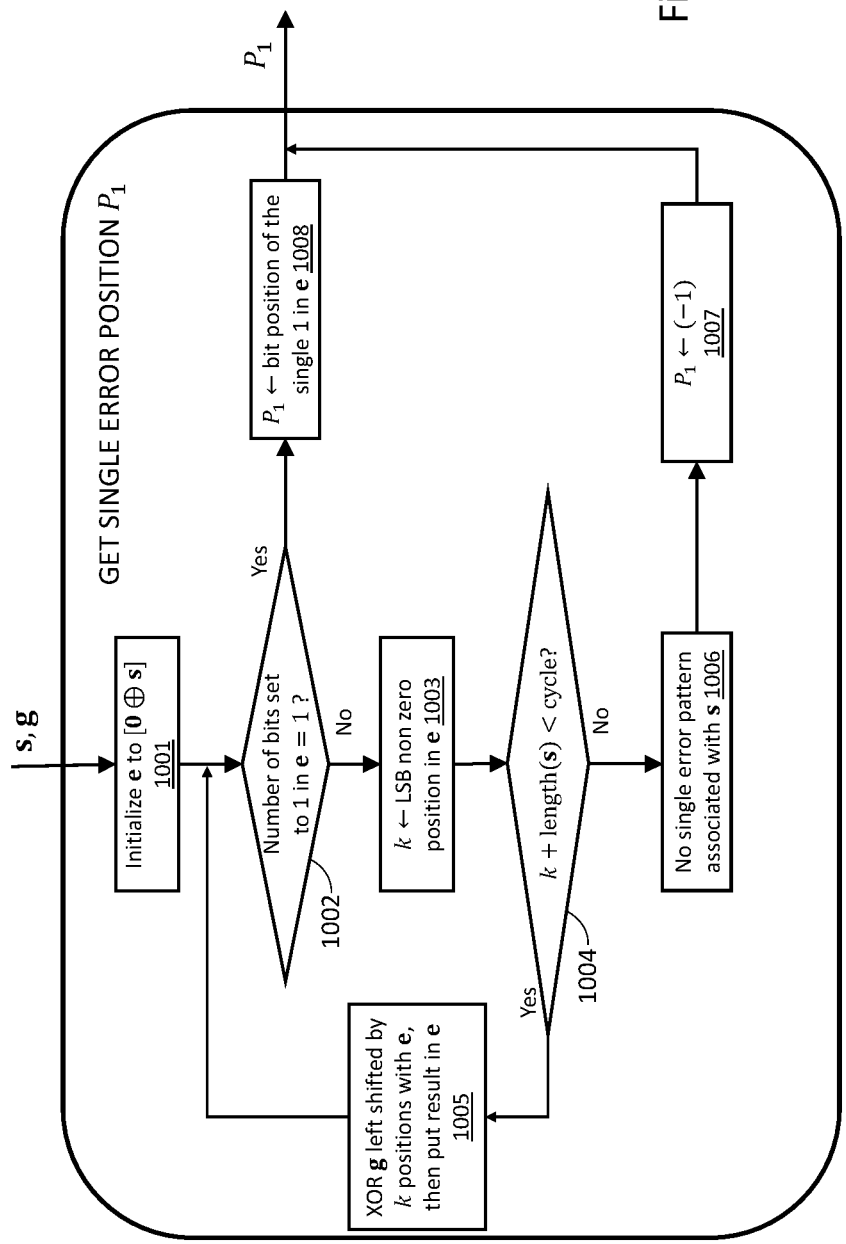

Algorithm 8 presents one embodiment of a method for determining patterns having a single bit error. One skilled in the art will recognize that the method described above may also be performed using algorithms other than Algorithm 8. Note that the symbol $\wedge$ represents the AND bitwise operation (i.e. $e \wedge 1$ returns 1 if the LSB of e equals 1 and returns 0 otherwise) and length (a) represent the length, in bits, of a binary vector a. FIG. 10 shows a flowchart outlining another embodiment of the method of Algorithm 8.

---

Algorithm 8

---

GetSingleBitErrorPosition(s, g, cycle)
Inputs:
• s the syndrome
• g: the vector associated with the generator polynomial used to compute the CRC
• cycle: the length of the generator polynomial cycle (in bits)
Output:
• $P_1$ the single error position associated to s
// Let e be a vector of length cycle
e ← 0 ⊕ s    // The n-LSB bits of e are set to s
$P_1$ ← (−1) // Initialization of error position $P_1$ to -1 to handle all error cases
// If the error was in the CRC at the bit position where s is non-zero
if sum(e)=1 then
    $P_1$ ← 0
    while (e $\wedge$ 1) = 0
        e ← e >> 1
        $P_1$ ← $P_1$ + 1
    endwhile
    return $P_1$
endif
k ← NZLSB(e)   // k is the least significant bit position of e with a non-zero bit value
while( k + length(s) < cycle)
    e ← e ⊕ (g << k)   // generates 0 at position k for updated e
    if sum(e)=1 then
        $P_1$ ← 0
        while (e $\wedge$ 1) = 0
            e ← e >> 1
            $P_1$ ← $P_1$ + 1
        endwhile
        return $P_1$
    endif
    k ← NZLSB(e)
endwhile

---

The generation of the table for single bit error correction may be based on the single error distance computed by Algorithm 8. For each possible value of s in single error cases (i.e. the number of non-zero terms in s is odd if g has an even parity), the position of the associated single error is computed. This value is stored at the index corresponding to the actual value of s in order to be accessed instantly.

Figure 8:
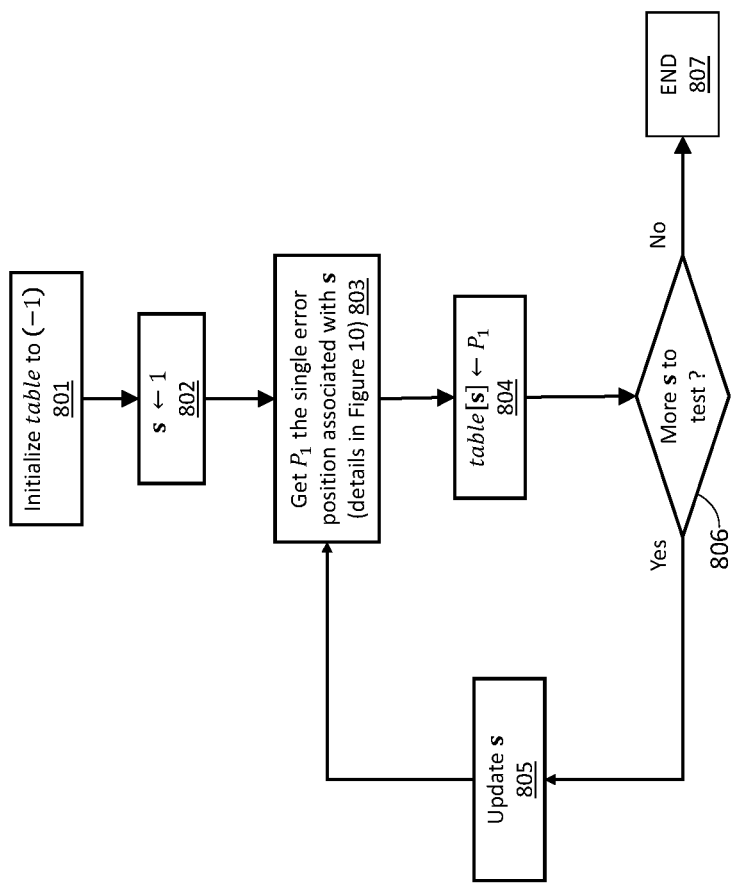

Algorithm 9 presents one embodiment of a method for generating a table for single bit error correction. One skilled in the art will recognize that the method described above may also be performed using algorithms other than Algorithm 9. For instance, if g has an odd parity, then each vector s of length n must be tested in Algorithm 9 without restriction. FIG. 8 shows a flowchart outlining the method of Algorithm 9.

---
Algorithm 9
---

TableGenerationSingleBit(g, cycle)
Inputs:
- g: the vector associated with the generator polynomial used to compute the CRC
- cycle: the length of the generator polynomial cycle (in bits)

Note: n = length(g) − 1
Output:
- T[0 ... $2^n$ − 1]: indexed table containing the single error distance for each syndrome.

Note: the table is indexed as T[idx], for $0 \le idx \le 2^n - 1$.
T[0 ... $2^n$ − 1] ← −1 // Initialization of the table to -1
for each vector s of length n having an odd number of non-zero bit terms
$P_1$ ← GetSingleBitErrorPosition(s, g, cycle)
T[s] ← $P_1$
endfor
return T[0 ... $2^n$ − 1]

---

An example of the output of Algorithm 9 applied to a CRC-5-ITU of generator polynomial $g(x)=x^5+x^4+x^2+1$ is illustrated below:

| idx | $P_1$ |
|---|---|
| 0 | −1 |
| 1 | 0 |
| 2 | 1 |
| 3 | −1 |
| 4 | 2 |
| 5 | −1 |
| 6 | −1 |
| 7 | 10 |
| 8 | 3 |
| 9 | −1 |
| 10 | −1 |
| 11 | 7 |
| 12 | −1 |
| 13 | 13 |
| 14 | 11 |
| 15 | −1 |
| 16 | 4 |
| 17 | −1 |
| 18 | −1 |
| 19 | −1 |
| 20 | −1 |
| 21 | 5 |
| 22 | 8 |
| 23 | −1 |
| 24 | −1 |
| 25 | 9 |
| 26 | 14 |
| 27 | −1 |
| 28 | 12 |
| 29 | −1 |
| 30 | −1 |
| 31 | 6 |

To determine if a single error has occurred within the packet, a previously implemented table containing the output of Algorithm 5 is used to obtain the error position. There are three distinct outcomes to this algorithm: (1) The error position is out of the packet (i.e. the distance is larger or equal to the length of the packet). In such case, there is no candidate and the single bit error correction cannot be conducted. (2) A candidate is identified within the length of the packet and the packet is not sufficiently large to contain a second single error. A single candidate is identified and can be instantly corrected. (3) A candidate is identified within the length of the packet and the packet is large enough to contain a second single error. There are several candidates in the list that must be further processed before correcting the packet.

Algorithm 10 presents one embodiment of a method for determining if a single error has occurred within a packet. One skilled in the art will recognize that the method described above may also be performed using algorithms other than Algorithm 10.

---
Algorithm 10
---

SingleBitErrorPatternDetermination(s, n, m, cycle, T[0 ... $2^n$ − 1])
Inputs:
- s: the computed syndrome vector
- n: the length of the syndrome (in bits)
- m: the length of the packet (in bits)
- cycle: the length of the generator polynomial cycle (in bits)
- T[0 ... $2^n$ − 1]: indexed table containing the single error distance for each syndrome value. Note: the table is indexed as T[idx], for $0 \le idx \le 2^n - 1$.

Output:
- $E_1$ list of single error candidates (i.e. bit error patterns containing a single bit set to 1)

$E_1$ ← { } // Initialize $E_1$ to an empty set
// Get the associated single error position $P_1$ from the indexed table for the given s
$P_1$ ← T[s]
if $P_1 \ne -1$ then
while ($P_1 < m + n$) // Handle single errors in the entire length of the packet
e ← 0    // e is a vector of length m + n
Set $e_{P_1}$ to 1
Add e to $E_1$
$P_1$ ← $P_1$ + cycle // The cycle is the periodicity length of the generator polynomial vector
endwhile
endif
return $E_1$

---

It should be noted that for many even generator polynomials: cycle=$2^{n-1}-1$. Examples of cycle length for several widely used generator polynomials include: (1) CRC8-CCITT ($x^8+x^2+x+1$): cycle=127=$2^7-1$; (2) CRC16-CCITT ($x^{16}+x^{12}+x^5+1$): cycle=32 767=$2^{15}-1$; (3) CRC24-BLE ($x^{24}+x^{10}+x^9+x^6+x^4+x^3+x+1$): cycle=8 388 607=$2^{23}-1$.

Note that the total packet length is m+n since the payload contains m bits and we append n bits of CRC. It is important to note that it is possible that some syndrome values will not lead to any single error at all. For those syndrome values, it is recommended to put a negative relative distance (e.g. −1) in the table to indicate that there is no valid relative distance. But other values not interfering with the set of error positions are possible to indicate that there is no solution associated with a position in the table (with a syndrome).

Multiple bit errors correction uses forced bit positions (some positions are forced to '1' and others to '0') to handle the whole set of possible erroneous patterns. Forced bit positions can be either set to '1' or left to '1' depending on their prior value. Once forced positions are set, the search for the last error position is conducted using Algorithm 3, 4 or 5.

To test every possibility, every forced bit position is tested throughout the process. In the case of two errors management, forced bit position starts at LSB and goes toward MSB bit by bit at each step. When the forced bit is modified, some operations must be conducted. (1) The previous forced position must be set to '0' by XORing g at this position. (2) The new forced bit position must be set to '1' by either adding a shifted version of g or leaving the position to '1' depending on its prior value.

Such steps conducted for each forced bit position can increase the computational complexity of the method. Since these steps are fixed for a given syndrome s, we can save complexity by storing the next element (i.e. the obtained syndrome when cancelling the previous forced bit and setting the new one to '1') for each possible syndrome. This way, a new column containing the next element for each syndrome is added to the reference table to generate a linked list (a chain of next syndromes) which reduces the complexity of the method.

FIGS. 8-11 are flowcharts illustrating details of how tables are generated for different instances of the method described above.

According to one embodiment, FIG. 8 illustrates the generation of the single bit error position, comprising initializing the table to (−1) at step 801, initializing the syndrome to 1 at step 802, obtaining the relative position of the single error at step 803. The resulting position is stored in the table at index s at step 804. We repeat the process until all syndromes are tested at step 806, by successively updating the syndrome in step 805 and performing steps 803 and 804. Once all syndromes are tested, the process is ended in step 807.

Figure 9:
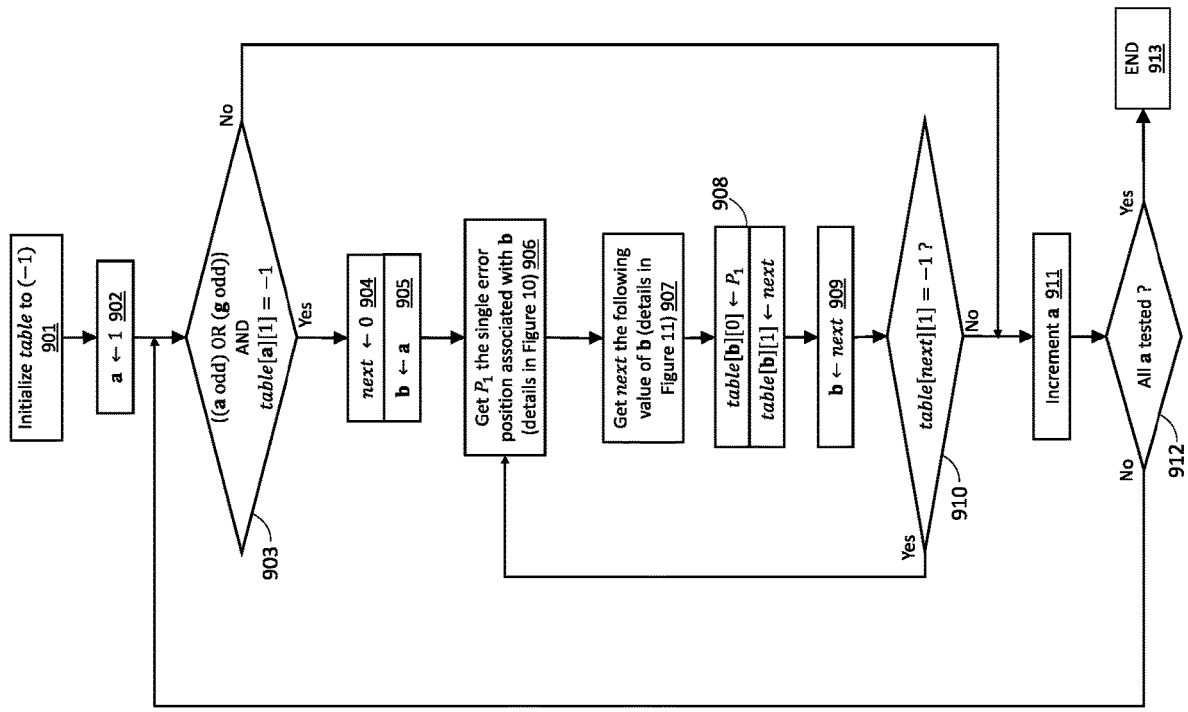

FIG. 9 is a flowchart representing the generation of the lookup table as in Algorithm 11. At steps 901 and 902, the table is initialized to (−1), and the tested syndrome a is initialized to 1. If a corresponds to a potential single error pattern and has not been tested yet at branch point 903, steps 904-910 are processed. We initialize the next element and a local syndrome b at steps 904 and 905 respectively. We get both the relative single error position $P_1$ and the next element at steps 906 and 907 respectively and then store their values in the first and second columns of lookup table at the index b at step 908. The syndrome b is then updated and takes the next value at step 909. If the next element has already been processed at branch point 910, we increment the value of a at step 911. When all syndromes a have been tested at branch point 912, we end the process at step 913.

FIG. 10 is a flowchart detailing the steps 803 and 906 from FIGS. 8 and 9, respectively, to get the single error position from a given syndrome and generator polynomial. We first initialize the error vector e to zeros and add the syndrome value at step 1001. We check the number of non-zero bits at branch point 1002. If it is equal to 1, then the single error position is identified at step 1008. If not, we set the current position k as the LSB non-zero position in e at step 1003 and check if we are still within the range of the packet at branch point 1004. If we are still in such range, we XOR g left shifted by k positions with e, store the result in e and perform again steps 1002-1004. If we happen to be out of the range of the packet without any single pattern for syndrome s at step 1006, we set the single error position to (−1) at step 1007 to indicate that no error pattern was found during the process.

Figure 11:
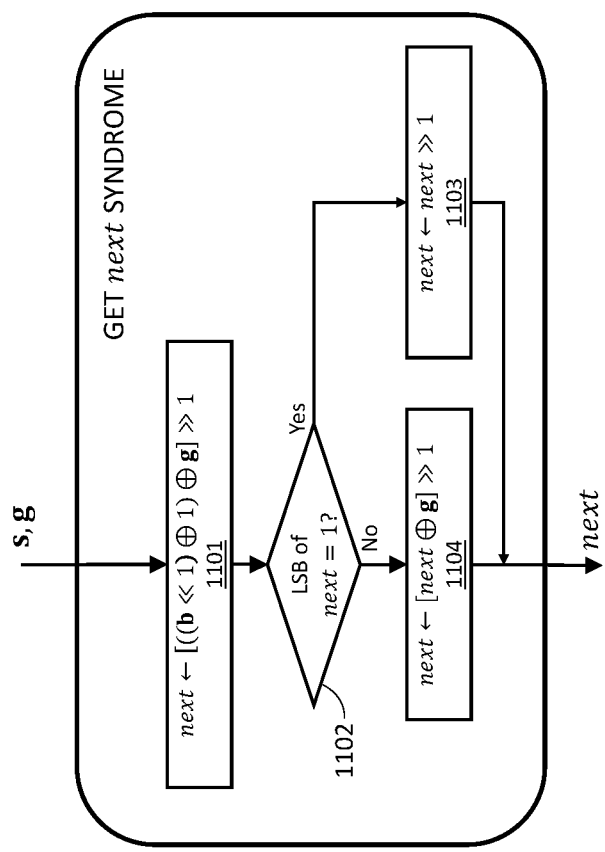

FIG. 11 is a flowchart detailing step 907 of FIG. 9, in which the next normalized element is set according to a given syndrome and generator polynomial. The next element is initialized by canceling the previously forced bit error position implicit to the normalized syndrome b in a normalized manner at step 1101. If the LSB of the next element is 1 at branch point 1102, the next element is right shifted at step 1103 as the forced position is already set. If not, we force the position at step 1104 by performing a XOR of g with the next element and then right-shift the result.

In Algorithm 11, we describe the generation of the reference table containing both the distance to the single error and the value of the next syndrome considering we force bits from LSB to MSB successively, i.e. adapting the syndrome where for which the forced position was at position k and then remove this forced position and force position k+1 instead. It is done in a normalized manner so that the table is always indexed with n bit values and, in the process, we transition from the context of a normalized syndrome to the context of the next normalized syndrome through specific operations on the former one. We use the term normalized syndrome to reflect the fact that they act like a syndrome, spanning over exactly n bits, but may be positioned anywhere in the packet. One skilled in the art will recognize that these steps and the method described above may also be performed by an algorithm other than Algorithm 11. FIGS. 9, 10 and 11 show a flowchart outlining the method of Algorithm 11.

---

Algorithm 11

---

TableGeneration ( g,cycle)
Inputs:
•     g: the vector associated with the generator polynomial used to compute the CRC
•     cycle: the length of the generator polynomial cycle (in bits)
Note: n: length(g) − 1
Output:
•     T[0 ... $2^n$ − 1][0 ... col − 1]: indexed table containing the single error
distance for each syndrome in the first column (col = 0) and the next syndrome to be processed in the second column (col = 1). Note: the table is indexed as T[idx][inf], for 0 ≤ idx ≤ $2^n$ − 1, 0 ≤ inf ≤ 1.
T[0 ... $2^n$ − 1][0 ... 1] ← (−1) // Initialize table T of $2^n$ rows by 2 columns to -1
for each binary vector a from 0 to $2^n$ − 1
if ((mod(sum(a), 2) = 1)OR(mod(sum(g),2) = 1)AND( T[a][1] = −1)) then
    next ← 0 // Value of next initialized to zero
    b ← a
// Iterate until the whole sequence is processed (i.e. stop when next is a)
do
// Get single error pos $P_1$ by scanning the SingleErrorPatterns table, looking for b
    $P_1$ ← GetSingleBitErrorPosition(b, g, cycle)
    // Cancel the previously forced bit error position implicit to the syndrome b
// in a normalized manner
    next ← [((b << 1) ⊕ 1) ⊕ g] >> 1
    // Place new forced bit error position in the next element in normalized manner
    if (next ∧ 1) = 1 // Check LSB value then
        next ← next >> 1 // LSB is 1 → first forced error is already set to 1
    else
        next ← [next ⊕ g] >> 1 // LSB is 0 → force first error by XORing g
    endif
    T[b][0] ← $P_1$ // Store values of $P_1$ and next in the table
    T[b][1] ← next
    b ← next         // Update a to the next value
while (T[next][1] = −1)
endif
endfor

---

Note: the line next←[((b<<1)⊕1)⊕g] allows to cancel the previously forced bit error position implicit to the current syndrome b in a normalized manner 1101, as presented in FIG. 11. It puts us in the context where b would be used for two errors. Indeed, we would consider (force) an error at a certain position (the right-most position here) followed by b to its left. This explains the part ((b<<1)⊕1), which creates this specific context. If the error position $P_1$ indicated by b is adequate, the search stops as we found the position of the two errors; one at the forced position and the other indicated by the table for a single error pattern ($P_1$). If the distance is inadequate (e.g. pointing outside the packet), it means that the considered error position is wrong and must be canceled by adding g. This explains the whole expression. Once we have next←[((b<<1)⊕1)⊕g], we need to establish the position of the new considered (forced) error. We know that the LSB of next←[((b<<1)⊕1)⊕g] is zero since we used g to cancel it (also we know that this forced position is wrong). Now we need to consider the LSB of [((b<<1)⊕1)⊕g]>>1, which comes next in the bits to consider (forced). If this bit is already 1, we need to extract pattern to its left and next←[((b<<1)⊕1)⊕g]>>2. Doing so, considering the two cases, we are placing a new forced bit error position in said next element in a normalized manner. This pattern becomes our next single error pattern to try. Otherwise, we need to force a 1 by adding g prior to extracting the next error pattern of interest.

Note that the table T[0 idx . . . 1][0 . . . col−1] is valid only for a given generator polynomial. For each generator polynomial of interest, a table must be determined and used. However, unlike state-of-the-art methods, it doesn't depend on a packet size. Although this invention describes the storage of the results of specific arithmetic operations, other operations could be stored as well in application contexts similar to the one described here.

The table T[0 . . . idx−1] [0 . . . col−1] containing the distance to the single-error position and the next element (represented in decimal here for convenience), corresponding to the next syndrome on which the search for a single error is performed, is illustrated below, applied to a CRC-5-ITU of generator polynomial $g(x)=x^5+x^4+x^2+1$. Note that the index column idx is only integrated for visual illustrations. The tables have been designed such that the row index corresponds to the syndrome value associated with the single error position $P_1$ at such row.

| idx | $P_1$ | next |
|---|---|---|
| 0 | −1 | −1 |
| 1 | 0 | 13 |
| 2 | 1 | 22 |
| 3 | −1 | −1 |
| 4 | 2 | 21 |
| 5 | −1 | −1 |
| 6 | −1 | −1 |
| 7 | 10 | 14 |
| 8 | 3 | 19 |
| 9 | −1 | −1 |
| 10 | −1 | −1 |
| 11 | 7 | 8 |
| 12 | −1 | −1 |
| 13 | 13 | 11 |
| 14 | 11 | 16 |
| 15 | −1 | −1 |
| 16 | 4 | 31 |
| 17 | −1 | −1 |
| 18 | −1 | −1 |
| 19 | −1 | 4 |
| 20 | −1 | −1 |
| 21 | 5 | 7 |
| 22 | 8 | 28 |
| 23 | −1 | −1 |
| 24 | −1 | −1 |
| 25 | 9 | 1 |
| 26 | 14 | 26 |
| 27 | −1 | −1 |
| 28 | 12 | 25 |
| 29 | −1 | −1 |
| 30 | −1 | −1 |
| 31 | 6 | 2 |

Double bit error management uses the relative distance and the next element from the table generated by Algorithm 11 to produce the list of possible error patterns containing two errors. At the initialization phase, the first error is forced at the LSB position of the syndrome. A check for the current value of the LSB is performed to determine the need for processing a first XOR operation with g (i.e. when the value of the LSB is '0'). Once this first operation is conducted, the entire process is performed within the reference table and does not need any other arithmetic operation to be conducted. By observing the value of the syndrome, it is possible to get the single error distance. If a single error occurs in the remaining length of the packet, a candidate corresponding to the pair of positions {$F_1$, $F_1$+1+$P_1$}, where $F_1$ is the forced position and $P_1$ is the single error distance for the tested syndrome.

Once this check is performed, the forced bit should be updated to the next position (previous forced bit set to '0', new forced bit set to '1'). This operation is already stored in the reference table; the next element can be instantly accessed.

This 2-steps process is repeated until the forced bit position reaches its maximum value at position (m+n−1), corresponding to the length of the protected data. The output data of the algorithm is the list of candidates stored during the process.

Figure 7:
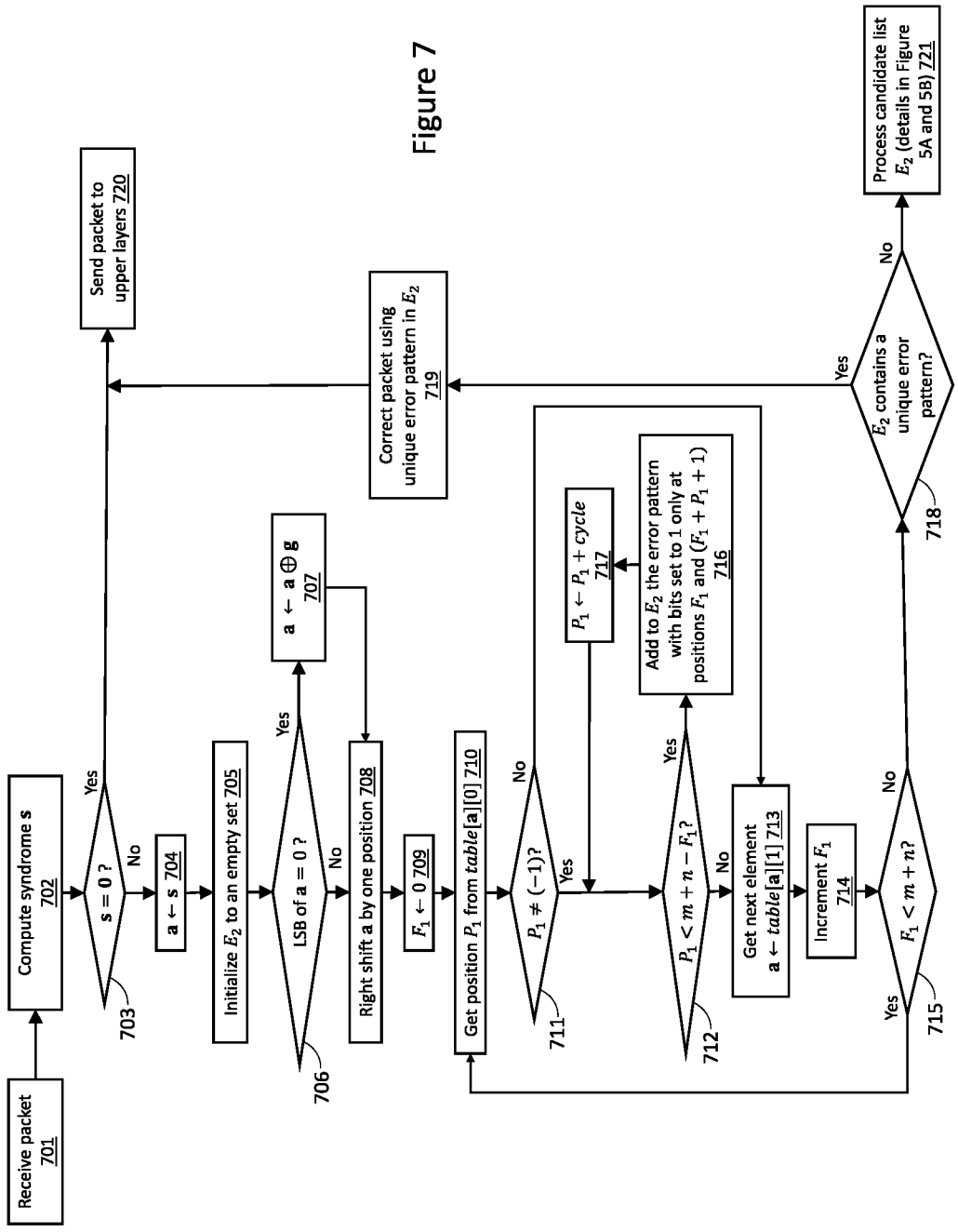

FIG. 7 shows a flowchart outlining this method. The method outlined in FIG. 7 may be performed at a receiver. In step 701, a packet may be received. This packet may include a payload and CRC information. In step 702, the CRC syndrome s may be calculated. This calculation may be performed as described above or using any method known in the art. At branch point 703, it may be determined whether or not s is equal to zero. If it is equal to zero, it may be determined that there is no error in the message and the packet may be sent to the upper layers as shown in step 720. If s is not equal to zero, potential error patterns including one erroneous bit may be determined following steps/branch points 704-717, which may be iterated while $P_1$<m+n. Then, at branch point 718, the set of potential error patterns $E_2$ may be examined to determine whether or not a unique error pattern has been identified. If one has been, the packet may be corrected based on that error pattern and sent to the upper layers, as shown in steps 719 and 720. If a unique error pattern has not been identified, the list of potential error patterns may be processed to find the most likely error pattern, as shown in step 721.

Algorithm 12 presents one embodiment of a method for determining bit error patterns for double bit errors. One skilled in the art will recognize that the method described above may also be performed using algorithms other than Algorithm 12.

Algorithm 12

DoubleBitErrorPatternDetermination(s,g, n,m, cycle, T[0 ... $2^n$ − 1][0 ... 1])
Inputs:
- s: the vector of the computed syndrome
- g: the generator polynomial vector of length n + 1
- n: the length of the syndrome (in bits)
- m: the length of the packet (in bits)
- cycle: the length of the generator polynomial cycle (in bits)
- T[0 ... $2^n$ − 1][0 ... col − 1]: indexed table containing the single error
distance for each syndrome in the first column (col = 0) and the next syndrome to be processed in the second column (col = 1). Note: the table is indexed as T[idx][inf], for 0 ≤ idx ≤ $2^n$ − 1, 0 ≤ inf ≤ 1.
Output:
- $E_2$ list of error patterns
$E_2$ ← { } // Initialize $E_2$ to an empty set
Let a be a vector of length n
// If the LSB is 0, place the first error by XORing g at the first position Algorithm 12

```
if s ∧ 1 = 0  then
   a ← [s ⊕ g] >> 1
else
   a ← s >> 1
endif
for F₁ = 0 to m + n - 1 // For the whole length of the packet
   // Get the associated error position P₁ from the indexed table for a
   P₁ ← T[a][0]
   if P₁ ≠ -1 then
   // Handle single errors in the remaining length of the packet
      while (P₁ < m + n - F₁)
         e ← 0   // e is a vector of length m + n
         Set e_{F₁} and e_{(F₁+P₁+1)} to 1
            Add e to E₂ // Store the pair of error positions as a candidate
            P₁ ← P₁ + cycle // Cycle is the periodicity length of the g(x)
      endwhile
   endif
// Update the value of a to the next one (increment by one the position of
the error of lowest degree)
   a ← T[a][1]
endfor
```

N errors management is based on the same strategy. The difference lies in the number of fixed errors in the process and their management. For example, three errors management can be handled by forcing 2 bit positions to '1' and searching for the last error with a single error management. However, the algorithm to handle two errors is more efficient because of the implementation of the next element within the reference table. Thus, three error management can be handled more efficiently by forcing only one position to '1' and performing a two errors management on the remaining length of the packet.

Figure 13:
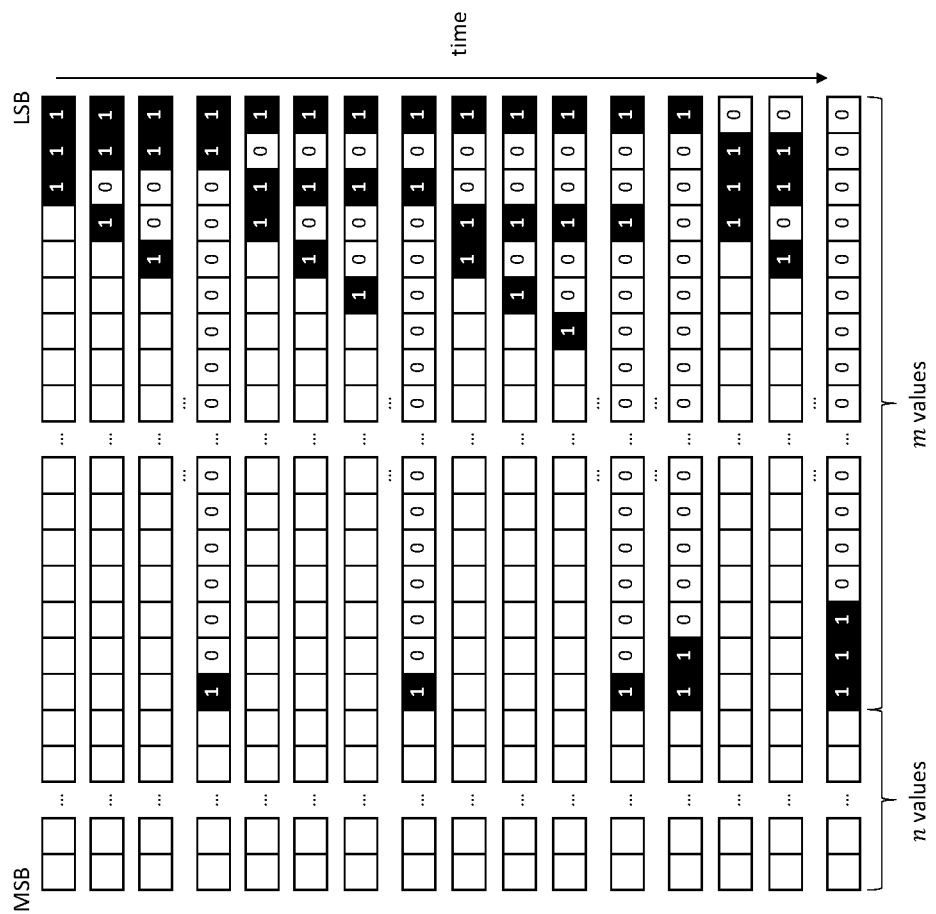
FIG. 13 is the evolution of three forced positions through time according to the present disclosure.

This method can be extended to N>2 errors. The concept is to force N−2 bit positions to '1' and to operate a two-errors management on the remaining length. The strategy has been explained earlier. An efficient way to manage forced bit position is illustrated in FIG. 13. In this figure, the forced bits are represented as black cells, and the remaining length on which the two-errors algorithm is performed are represented as blank cells. At the initialization of the algorithm, forced bit position are set to be the N−2 LSB positions of the syndrome. As the algorithm goes on, the leftmost forced bit position is moved toward the MSB. Once it reaches its final value (i.e. at position m−2, the second leftmost value moves by one position toward the MSB and the leftmost value is reinitialized to the following value. Between two forced positions, there are only '0' bit values since each time a forced bit position is updated, it sets to '0' its previous position. The process ends when the forced bit positions reach positions (m−(N−1), ..., m−2). Algorithms 13 and 14 presents two embodiments of a method for determining bit error patterns for multiple bit errors (3 or more errors). One skilled in the art will recognize that the method described above may also be performed using algorithms other than Algorithms 13 and 14.

Algorithm 13

MultipleBitErrorPatternDetermination(s,g,n,m, N, cycle, T[0 ... 2ⁿ − 1][0 ... 1])
Inputs:
- s: the vector of the computed syndrome
- g: the generator polynomial vector of length n + 1
- n: the length of the syndrome (in bits)
- m: the length of the packet (in bits)
- N : the number of errors to search for. We must have N ≥ 3.

Algorithm 13

- cycle: the length of the generator polynomial cycle (in bits)
- T[0 ... 2ⁿ − 1][0 ... col − 1]: indexed table containing the single error distance for each syndrome in the first column (col = 0) and the next syndrome to be processed in the second column (col = 1). Note: the table is indexed as T[idx][inf], for 0 ≤ idx 2ⁿ − 1, 0 ≤ inf ≤ 1.

Output:
- $E_N$ list of error patterns containing up to N errors

```
E_N ← { } // Initialize E_N to an empty set
Let e be a vector of length m + n
k ← N   // Initialize local number of errors k to N
while k > 1   // For every number of errors from k to 2
   F ← (0, ... , k − 2)   // sorted list of (k − 1) LSB positions among m
   Let a be a vector of length m + n
   a ← 0 ⊕ s   // The n-most LSB bits of a are set to s
   while F ≠ (m + n − k + 1, ... , m + n − 1) // sorted list of (k − 1)
         MSB positions among m + n
      // We force positions to 1 up to position F_{k−2}
      for i = 0 to F_{k−2}
         // equivalent to " e_j ! = v_j" in Algo 3 and 4
         if (a_i = 0 AND i ∈ F) OR (a_i = 1 AND i ∉ F) then
            a ← [a ⊕ g << i]
         endif
      endfor
      // If the zero value of a at position F_{k−2}+1, force it to 1 by XORing with g
      i = F_{k−2}+1
      if (a_i = 0) then
         a ← [a ⊕ g << i]
      endif
      for i = F_{k−2} + 1 to m + n − 1 // For the whole length of the payload
         // Get the associated error position P₁ from the indexed table for a
         // Note that we actually send the n LSBs of a >> F_{N−1}
         b = LSB( a >> F_{k−1}, n)  // LSB( a, n) extracts the n LSB of a
         Add SingleBitErrorPatternDetermination(b,g, n, m + n − F_{k−1}, cycle, T) to E_N
         // Update the value of a to the next one (increment by one the position of the error of lowest degree)
         a ← a ⊕ [g << F_{k−1}]   // Cancel forced bit at F_{k−1}
         if ((a_{(F_{k−1}+1)} = 0) AND (F_{k−1} < m + n − 1)) then
            a ← a ⊕ [g << F_{k−1} + 1]   // Force bit at F_{k−1}+1 for next loop
         endif
         UpdateForcedPositions(F, m + n − 1) // update forced error positions
      endfor
      a ← 0 ⊕ s // recall original s
   endwhile
   k ← k − 1   // Decrease k for the next loop
endwhile
// Perform single error correction when k = 1
P₁ ← T[s][0]
if P₁ ≠ (−1) then
   while (P₁ < m + n) // Handle single errors in the entire length of the packet
      e ← 0    // e is a vector of length m + n
      Set e_{P₁} to 1
      Add e to E_N
      P₁ ← P₁ + cycle   // The cycle is the periodicity length of the generator polynomial vector
   endwhile
endif
```

Remarks: We notice that vector a contains relevant information for the algorithm only on a range of n bits. The bits before and after that range are either zero or known (the forced bit position). Therefore, we can normalize vector a and keep only the non-zero and not known parts and keep only then informative bits of vector a. Because of this normalization, vector g does not have to be left-shifted anymore as we are in effect moving a window over vector a. Each time we force a bit at a certain position, we right-shift vector a by one position since we know that the bit at such position is now 1. We can also avoid calling the function SingleBitErrorPatternDetermination and use directly the Table T. Finally, the last two operations of updating a, i.e. a←a⊕[g<<F_{N−1}] and a←a⊕[g<<F_{N−1}+1], which consist in cancelling the forced 1 and forcing one at a new position can be stored in a table which would allow to save computations. It should be noted that the first operation, $a \leftarrow a \oplus [g<<F_{N-1}]$, is rather tricky as it requires remembering that, conceptually, the bit right to a is a 1. Therefore, to cancel its effect, we need to left shift a by one position and 1 (the forced bit), then add g to cancel it, and finally right shift the result by one position. This is shown in Algorithm 11 responsible for TableGeneration at line next← $[((a<<1)\oplus 1)\oplus g]>>1$. The second operation, $a \leftarrow a \oplus [g<<F_{N-1}+1]$, is rather straightforward as it requires forcing a bit at current position. We do this by adding g to a only if the LSB of a is 1 and then performing a rightshift of one position on a. Finally, the result of both operations is stored in the table as shown in Algorithm 13. The resulting algorithm is as follows. Note that it is possible to store, using the same strategy, the result of $a \leftarrow [a \oplus g]>>1$ and $a \leftarrow a>>1$ if it would allow better performance (depending on the processor on which the algorithm is implemented).

---

Algorithm 14

---

MultipleBitErrorPatternDetermination(s,g,n,m, N, cycle, T[0 ... $2^n$ – 1] [0 ... 1])
Inputs:
- s: the vector of the computed syndrome
- g: the generator polynomial vector of length n + 1
- n: the length of the syndrome (in bits)
- m: the length of the packet (in bits)
- N : the number of errors to search for. We must have N ≥ 3.
- cycle: the length of the generator polynomial cycle (in bits)
- T[0 ... $2^n$ – 1][0 ... col – 1]: indexed table containing the single error
distance for each syndrome in the first column (col = 0) and the next syndrome to be processed in the second column (col = 1). Note: the table is indexed as T[idx][inf], for 0 ≤ idx ≤ $2^n$ – 1, 0 ≤ inf ≤ 1.
Output:
- $E_N$ list of error patterns containing up to N errors $E_N \leftarrow \{ \}$ // Initialize $E_N$ to an empty set
Let e be a vector of length m + n
Let a be a vector of length n
k ← N // Initialize local number of errors k to N
while k > 1   // For every number of errors from k to 2
$\mathcal{F} \leftarrow (0, ... , k - 2)$   // sorted list of (k – 1) LSB positions among m + n
a ← s
while $\mathcal{F} \neq (m + n - k + 1, ... , m + n - 1)$ // sorted list of (k – 1) MSB positions among m + n
// We force positions to 1 up to position $F_{k-2}$
for i = 0 to $F_{k-2}$
if (a ∧ 1 = 0 AND i ∈ $\mathcal{F}$) OR (a ∧ 1 = 1 AND i ∉ $\mathcal{F}$) then
a ← [a ⊕ g] >> 1
else
a ← a >> 1
endif
endfor
// Force but at $F_{k-2}$ + 1
// If the LSB is 0, place error $F_{k-1}$ by XORing g at the first position
if a ∧ 1 = 0 then
a ← [a ⊕ g] >> 1
else
a ← a >> 1
endif
for i = $F_{k-2}$ + 1 to m + n – 1 // For the whole length of the payload
// Get associated error position $P_1$ from the indexed table for a
$P_1 \leftarrow T[a][0]$
if $P_1 \neq -1$ then
// Handle single errors in the remaining length of the packet
while ($P_1 < m + n - F_{k-1}$)
e ← 0
Set bit values to 1 at positions $P_1$ and $(F_1, ... , F_{k-1})$ of e
Add e to $E_N$ // Store set of error positions as a candidate
$P_1 \leftarrow P_1$ + cycle // Cycle = periodicity length of g(x)
endwhile
endif
// Update the value of a to the next one (increment by one the position of the error of lowest degree)

---

-continued

Algorithm 14

--- a ← T[a][1]
UpdateForcedPositions($\mathcal{F}$, m + n – 1) // update $\mathcal{F}$
endfor
a ← s   // recall original s
endwhile
k ← k – 1   // Decrease k for the next loop
Endwhile
// Perform single error correction when k = 1
$P_1 \leftarrow T[s][0]$
if $P_1 \neq (-1)$ then
while ($P_1 < m + n$) // Handle single errors in the entire length of the packet
e ← 0   // e is a vector of length m + n
Set $e_{P_1}$ to 1
Add e to $E_N$
$P_1 \leftarrow P_1$ + cycle // The cycle is the periodicity length of the generator polynomial vector
enwhile
endif

---

For each forced bit position, a modified value of the syndrome is stored in memory. This modified syndrome is the accumulation of all the arithmetic operations performed on the original syndrome up to the forced bit position in question to reach the desired result up to that bit position. For instance, for position $F_j$, it contains all additions of shifted versions of g leading to 1s at all k for which $F_k<F_j$ and 0s at all other positions p such that $p<F_j$. We store a modified syndrome value for each position $F_j$ for which we forced a 1. It is thus possible to recall the original state of a syndrome when the leftmost forced bit position reaches position m (i.e. update of other forced bit positions). The value of the next syndrome can be accessed using the 'next' element in the reference table.

In summary, here are the key elements of Algorithm 13 which provides the error patterns for exactly N errors. Note that to obtain the whole set of error patterns that $E_N$ should contain for a given syndrome, we would have to successively call Algorithm 14 for 1, 2, . . . , errors and add all the results to $E_N$. For each value of N, the algorithm successively assigns forced values of '1' to N–2 positions represented in a sorted list $(F_1, ... , F_{N-2})$ (sorted in an ascending order) for all possible sets of such N–2 bit positions within m positions, then, for each set: 1) enforces the desired values (i.e. 1 at forced positions and 0 otherwise) from positions 0 to $F_{N-2}$, then 2) tries forcing a bit to 1 at $F_{N-1}$ from $(F_{N-2}+1)$ to (m–1) and each time identifies the position of the remaining single error position using a table providing a relative distance to that single error and, if appropriate, adding solutions to $E_N$ considering cycles. In step 1, this enforcing desired values is performed by successively adding (i.e. XORing), from position 0 to position $F_{N-2}$, the current vector s with vector g when either the LSB value in s is not 1 at a position forced to 1 or the LSB value in s is not 0 at a non-forced position. After each position is processed, and whether or not s has been modified, vector s is right-shifted by one position. Throughout the algorithm, we apply right shifts to normalize the size of s to n bits and therefore enable the use of a low memory table where the indexing is always performed using an n bit syndrome. It can be observed that the right shift by one position always gets rid of a value of 0 at the LSB and therefore there is in fact no loss of bit value information. In step 2, the algorithm initializes the next phase of the process by adding (i.e. XORing), the current vector s with vector g if the LSB value in s is not 1. Then whether the addition was performed or not, vector s is right-shifted by one position to normalize it as discussed. Then, we successively set the forced position $F_{N-1}$ to each position from $(F_{N-2}+1)$ to $(m-1)$ and determine, using the table if a single error occurs within the packet length for the whole set of forced positions (since the effect of each forced position is reflected in s); each time we increase the forced position $F_{N-1}$, we use the table to get the next element s and save computations. We can note that table-based algorithms force errors up to position m+n−1, whereas table-free algorithms force errors up to position m−1. The last error position $P_1$ is directly accessible in table-based algorithms without scanning the vector, searching for such position. Thus, if several errors are located in then last positions of the packet, the only way to identify them is to force errors up to the end of the packet, while keeping the condition that $P_1 < m+n-F_{N-1}$, to ensure valid error patterns (i.e. all the errors are located within the length of the packet).

Looking back at equation (6), we can observe that the operations of Algorithms 13 and 14, similarly to those of Algorithms 1 to 5, create terms that maintain the equivalence relationship with the computed syndrome since we always add shifted versions of the generator polynomial and accumulate the result (remember that $E_M$ is the equivalence class containing s(x)). This is done on vector s in Algorithm 13 and on vector e in Algorithms 1 to 5. They reflect the cancellation or forcing of error values (1s) at specific positions so that we can obtain error patterns with few errors (from the cancellation process) while maintaining equivalence relationship (valid error patterns since they lead to the syndrome when computing the CRC considering them). The major difference in Algorithm 13 is that we always right shift the vector by one position after each operation to maintain it within a range of n bits, i.e. normalize it, which enables us to use a unified table (indexed with an n bits value) to obtain its distance to a single error position and/or the next element. Indeed, as shown in Algorithm 11, the next element s is obtained by assuming it requires to first reverse the effect of forcing the (imaginary) bit to the right of its LSB (the part next←[((s<<1)⊕1)⊕g]>>1) in the algorithm) and then forcing its LSB to 1 by performing either next←next>>1 or next←[next⊕g]>>1 on the result. The algorithm thus considers the updating of the vector s with a forced position at j to having a forced position at j+1 (and not at j anymore).

Thus, whether the algorithmic operations of forcing and cancelling bits at certain positions using the generator polynomial, while maintaining the equivalence relationship with the original syndrome, are performed explicitly using arithmetic operations or implicitly using a table representative of such arithmetic operations, these algorithmic operations are equivalent as it related to this invention.

What is claimed is:

1. A computer-implemented method for correcting a received data packet, the data packet comprising a payload d(x) and cyclic redundancy check (CRC) information, calculated using a generator polynomial g(x), the method comprising:
calculating a syndrome value according to said data packet and said generator polynomial g(x);
generating a list of potential error vectors $E_N$ according to one of the following:
A)
initializing an error vector e using said syndrome value;
determining that the error vector e is a potential error vector according to a number of bits in the error vector e that have a value that is indicative of an error;
adding the error vector e to the list of potential error vectors $E_N$ according to the determining;
generating an additional error vector e' by adding a shifted version of a vector g to the error vector e at a bit position, where the bit position is determined according to a bit value of the error vector e and according to previously determined bit positions, the vector g being associated with the generator polynomial g(x); and
repeating the determining, the adding and the generating by using the additional error vector e' as the error vector e, for each said bit position of said data packet;
B)
providing a lookup table comprising a plurality of syndrome value indexes and entries each entry corresponding to a relative distance to a single error and a next normalized syndrome value, the entries being associated to one of the plurality of syndrome value indexes in accordance with previously determined possible syndrome values for said generator polynomial g(x);
identifying a relative distance to a single error and a next normalized syndrome value from the entries of the lookup table according to one of the plurality of syndrome value indexes corresponding to the syndrome value;
generating an error vector e according to said identified relative distance to a single error;
determining that said error vector e is a potential error vector according to said relative distance to the single error;
adding said identified error vector e to the list of potential error vectors $E_N$ according to the determining; and
repeating the previous four steps for each bit in said payload d(x), using the identified next normalized syndrome value as the syndrome value;
returning the list $E_N$;
selecting a potential error vector e from the list $E_N$; and
correcting the packet based on the selected potential error vector e.

2. The computer implemented method of claim 1, wherein initializing the error vector e comprises initializing e to [c⊕s], where c is a vector of length m+n having only bit values that are not indicative of an error, m is the length of the payload, n is the length of the CRC information and s is the computed syndrome.

3. The computer implemented method of claim 1, wherein said generating said list of potential error vectors comprises (A), selecting one bit position of e as a current position comprises selecting the least significant bit, and wherein updating the current position comprises incrementing the current position from the least significant bit to the most significant bit.

4. The method of claim 1, wherein selecting the error vector e from the list $E_N$ comprises determining which error vector e has the highest probability of being the correct error vector e based on soft information.

5. The method of claim 1, wherein selecting the error vector e from the list $E_N$ comprises selecting the error vector e with a smallest number of bits having a value that is indicative of an error.

6. The method of claim 1, wherein said correcting at least one bit error in the received packet comprises eliminating error vectors e from the list $E_N$ according to additional information about the packet.

7. The method of claim 6, wherein said additional information about the packet comprises at least one fixed or predictable bit value in the packet.

8. The method of claim 4, wherein said additional information about the packet comprises a checksum information.

9. The method of claim 1, wherein said generating said list of potential error vectors comprises (A), further comprising successively forcing one or more bits of the error vector e to a value that is indicative of an error.

10. The method of claim 1, wherein said generating said list of potential error vectors comprises (A) or (B), further comprising determining a threshold value that is indicative of a number of error vectors e that are added to the list of potential error vectors $E_N$.

11. The method of claim 10, wherein said generating said list of potential error vectors comprises (A) or (B), further comprising determining the threshold value according to the number of bits used by the CRC.

12. The method of claim 10, wherein said generating said list of potential error vectors comprises (A) or (B), and the threshold value depends on the packet size.

13. The method of claim 10, wherein said generating said list of potential error vectors comprises (A) or (B), and the threshold value does not exceed 3.

14. The method of claim 1, wherein said generating said list of potential error vectors comprises (A) or (B), and the threshold value is 1, further comprising determining when the syndrome value contains a single bit having a value indicative of an error and undertaking no bit correction in said received data packet.

15. The method of claim 1, wherein said generating said list of potential error vectors comprises (B) and wherein the next normalized syndrome value is determined for all possible syndrome values by, the following:
  canceling a previously forced bit error position implicit to a current syndrome in a normalized manner, the current syndrome being one of said all possible syndrome values;
  setting a result of the said canceling to a next element;
  placing a new forced bit error position in said next element in a normalized manner;
  associating a result of said placing to the syndrome value index of the lookup table.

16. The method of claim 1, further comprising determining when $E_N$ indicates a single bit error position and undertaking correction of said single bit error position.

17. The method of claim 1, wherein said generating said list of potential error vectors comprises (A) and the following steps:
  initializing an error vector e using said syndrome value;
  selecting one bit position of the error vector e having a bit value of '1' as a current position;
  determining a number of bits that have a value of 1 in the error vector e;
  if the number of bits is equal or below a threshold value, adding the error vector e to the list of potential error vectors $E_N$;
  updating the error vector e by adding a shifted version of a vector g at the current position, the vector g being associated with the generator polynomial g(x);
  updating the current position to a new bit position of the error vector e having a bit value of '1', the new bit position being a bit position which has not been the current position; and
  repeating the previous four steps until each bit position of the error vector e having a bit value of '1' has been the current position.

18. The method of claim 1, wherein said generating said list of potential error vectors comprises (B), further comprising:
  generating said lookup table including,
    for identifying the single error position, the following steps for each possible syndrome value:
      initializing an error vector e;
      selecting one bit position of the error vector e having a bit value of '1' as a current position;
      determining a number of bits that have a value of 1 in the error vector e;
      if the number of bits is equal to one, ending this process and storing the current position of that error in the table to the index corresponding to each possible syndrome value for a column associated with said single error position;
      updating the error vector e by adding a shifted version of a vector g, associated with the generator polynomial g(x), to the error vector e at the current position;
      updating the current position to a new bit position of the error vector e having a bit value of '1', the new bit position being a bit position which has not been the current position; and
      repeating the previous four steps until each bit position of the error vector e having a bit value of '1' has been the current position;
    for identifying the next normalized syndrome value, the following steps for each possible syndrome value:
      canceling the previously forced bit error position implicit to a current syndrome value in a normalized manner;
      setting the result of the said canceling to a next element;
      placing a new forced bit error position in said next element in a normalized manner;
      storing the result of said placing in the table to the index corresponding to the current syndrome value for a column associated with said next normalized syndrome.

19. A system comprising:
  a receiver configured to receive a packet comprising a payload d(x) and cyclic redundancy check (CRC) information, calculated using a generator polynomial g(x); and
  a processor and non-transitory memory storing executable instructions configured to analyze the packet, wherein analyzing the packet comprises determining if an error is present in the packet, and if an error is present, correcting it according to the method of claim 1.

* * * * *